(12) United States Patent
Kim et al.

(10) Patent No.: US 10,176,881 B2
(45) Date of Patent: Jan. 8, 2019

(54) NON-VOLATILE MEMORY DEVICES HAVING TEMPERATURE AND LOCATION DEPENDENT WORD LINE OPERATING VOLTAGES

(71) Applicant: Samsung Electronics Co., Ltd., Suwon-si, Gyeonggi-do (KR)

(72) Inventors: Jisuk Kim, Seoul (KR); Il Han Park, Suwon-si (KR); Se Hwan Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/462,381

(22) Filed: Mar. 17, 2017

(65) Prior Publication Data

US 2018/0061504 A1 Mar. 1, 2018

(30) Foreign Application Priority Data

Aug. 26, 2016 (KR) ........................ 10-2016-0109051

(51) Int. Cl.
*G11C 16/34* (2006.01)
*G11C 7/04* (2006.01)
*G11C 16/16* (2006.01)
*G11C 16/26* (2006.01)
*G11C 16/04* (2006.01)
*G11C 16/08* (2006.01)

(52) U.S. Cl.
CPC ............ *G11C 16/3459* (2013.01); *G11C 7/04* (2013.01); *G11C 16/16* (2013.01); *G11C 16/26* (2013.01); *G11C 16/0483* (2013.01); *G11C 16/08* (2013.01)

(58) Field of Classification Search
CPC ... G11C 16/3459; G11C 16/0483; G11C 6/16; G11C 6/26
See application file for complete search history.

(56) References Cited

U.S. PATENT DOCUMENTS

| 6,269,026 | B1 * | 7/2001 | Venkatesh | G11C 16/30 365/185.29 |
|---|---|---|---|---|
| 7,218,570 | B2 * | 5/2007 | So | G11C 5/063 365/230.06 |
| 7,411,830 | B2 | 8/2008 | Takeuchi et al. | |
| 7,460,407 | B2 | 12/2008 | Mokhlesi et al. | |
| 7,916,533 | B2 | 3/2011 | Dong et al. | |
| 8,018,777 | B2 | 9/2011 | Kang | |
| 8,164,957 | B2 * | 4/2012 | Sekar | G11C 5/146 365/185.17 |

(Continued)

FOREIGN PATENT DOCUMENTS

| JP | 2003-217287 A | 7/2003 |
|---|---|---|
| JP | 2007-299489 A | 11/2007 |

*Primary Examiner* — Vu Le
*Assistant Examiner* — Sung Cho
(74) *Attorney, Agent, or Firm* — Myers Bigel, P.A.

(57) ABSTRACT

A non-volatile memory device includes: a memory cell array including a memory cell string including a ground selection transistor and a plurality of serially connected non-volatile memory cells; a ground selection line connected to the ground selection transistor and a plurality of word lines connected to the plurality of memory cells; a voltage generator configured to generate a program verification voltage and a read voltage applied to the plurality of word lines; and a control circuit configured to control a compensation for the program verification voltage based on a program verification temperature offset, and control a to compensation for the read voltage based on a read temperature offset.

20 Claims, 33 Drawing Sheets

(56) References Cited

U.S. PATENT DOCUMENTS

| | | | |
|---|---|---|---|
| 8,659,966 B2* | 2/2014 | Choi | G11C 7/04 365/185.18 |
| 8,947,928 B2 | 2/2015 | Kim et al. | |
| 9,036,438 B2 | 5/2015 | Hemink et al. | |
| 9,508,446 B1* | 11/2016 | Chen | G11C 7/04 |
| 9,583,198 B1* | 2/2017 | Pang | G11C 16/10 |
| 2006/0291322 A1* | 12/2006 | Crippa | G11C 7/04 365/230.06 |
| 2007/0291567 A1* | 12/2007 | Mokhlesi | G11C 7/04 365/212 |
| 2008/0159007 A1* | 7/2008 | Sekar | G11C 16/3418 365/185.27 |
| 2009/0310408 A1* | 12/2009 | Lee | G11C 11/5628 365/185.03 |
| 2010/0073069 A1* | 3/2010 | Wang | G11C 5/143 327/513 |
| 2010/0110793 A1* | 5/2010 | Kim | G11C 5/143 365/185.18 |
| 2010/0110815 A1* | 5/2010 | Lee | G11C 5/143 365/211 |
| 2010/0157672 A1* | 6/2010 | Barkley | G11C 7/04 365/185.03 |
| 2010/0322005 A1* | 12/2010 | Dong | G11C 16/10 365/185.17 |
| 2012/0218823 A1* | 8/2012 | Tanzawa | G11C 5/14 365/185.18 |
| 2014/0136765 A1* | 5/2014 | Oh | G11C 16/0483 711/103 |
| 2016/0086675 A1* | 3/2016 | Ray | G11C 16/26 365/185.12 |
| 2016/0099049 A1 | 4/2016 | Lee et al. | |

\* cited by examiner (a) SLC (b) MLC

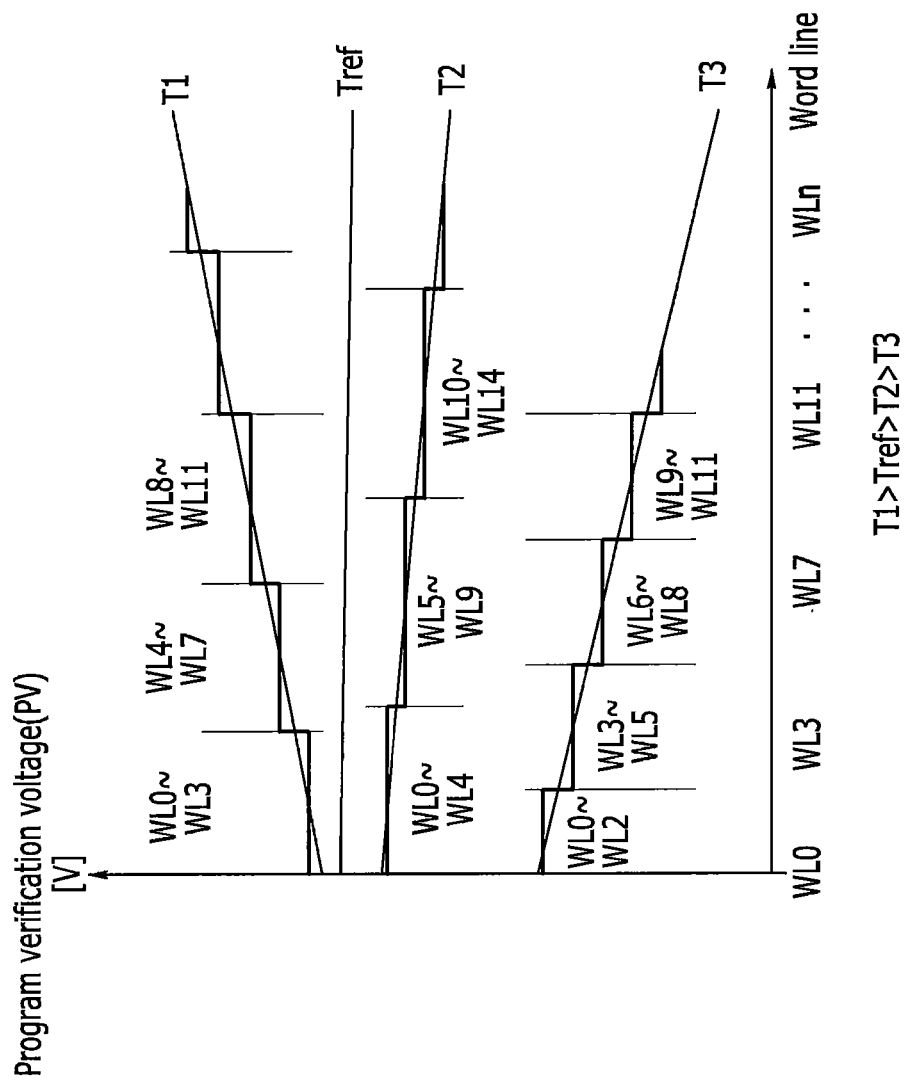

(a)　　　　　　　　　　(b)

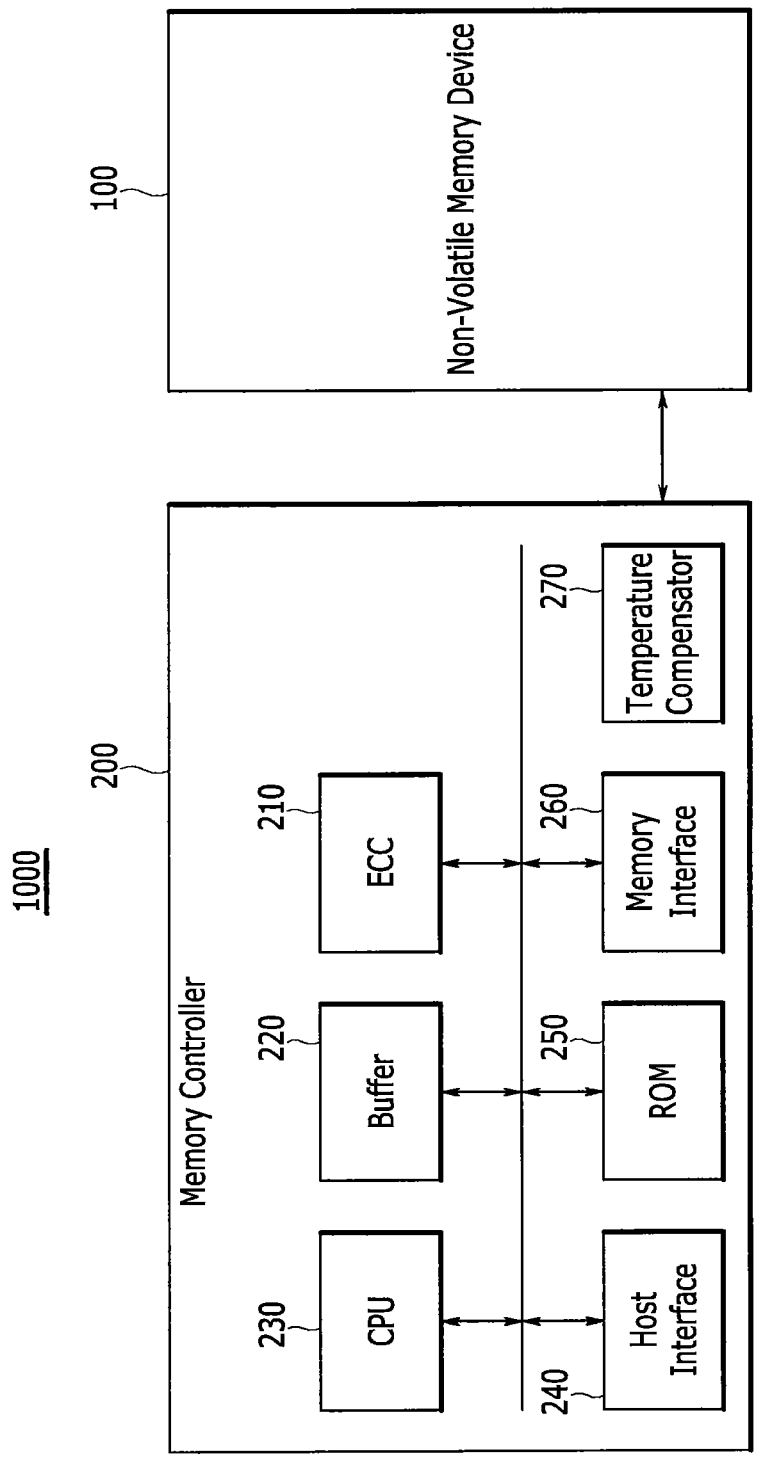

NON-VOLATILE MEMORY DEVICES HAVING TEMPERATURE AND LOCATION DEPENDENT WORD LINE OPERATING VOLTAGES

REFERENCE TO PRIORITY APPLICATION

This application claims priority to and the benefit of Korean Patent Application No. 10-2016-0109051, filed in the Korean Intellectual Property Office on Aug. 26, 2016, the entire contents of which are hereby incorporated herein by reference.

BACKGROUND (a) Technical Field

Aspects of the described technology relate to a non-volatile memory device.

(b) Description of the Related Art

Recently, according to a considerable increase in a storage capacity of a semiconductor memory device, competitiveness of the semiconductor memory device, which is capable of replacing an existing large data storage device including a hard disk, has gradually increased.

The semiconductor memory device is generally divided into a volatile memory device and a non-volatile memory device. When power of the non-volatile memory device is cut, the non-volatile memory device may maintain stored data without losing the data, and may be used as a storage device or a memory for a system. Recently, a flash memory device among the non-volatile memory devices is widely used as a large-capacity data storage device including a hard disk.

A memory cell array of the flash memory device may include a plurality of memory cell strings, and each of the memory cell strings may include a plurality of serially connected memory cells. A threshold voltage of the memory cell may be changed according to various operation conditions, and the changed threshold voltage causes a failure to read, thereby degrading reliability of the flash memory device. Accordingly, a technology for compensating for the degradation of reliability by the changed threshold voltage is required.

The above information disclosed in this Background section is only for enhancement of understanding of the background of the invention and therefore it may contain information that does not form the prior art that is already known in this country to a person of ordinary skill in the art.

SUMMARY

Aspects of the described technology have been made in an effort to provide a non-volatile memory device, which is capable of improving reliability, and a method of compensating for an operation voltage thereof.

An embodiment provides a non-volatile memory device, including: a memory cell array including a memory cell string including a ground selection transistor and a plurality of serially connected non-volatile memory cells; a ground selection line connected to the ground selection transistor and a plurality of word lines connected to the plurality of memory cells; a voltage generator configured to generate a program verification voltage and a read voltage applied to the plurality of word lines; and a control circuit configured to control a compensation for the program verification voltage based on a program verification temperature offset, and control a compensation for the read voltage based on a read temperature offset. The plurality of word lines may be divided into a plurality of word line groups including two or more word lines. The control circuit may set a program verification temperature offset and a read temperature offset in a corresponding word line group among the plurality of word line groups according to a distance between one word line in each of the plurality of word line groups and the ground selection line and an operation temperature.

Another embodiment provides a non-volatile memory device having a 3D structure, including: a plurality of memory cell strings formed by laminating a plurality of memory cells in a vertical direction to a substrate; a plurality of word lines connected to a ground selection transistor of each of the plurality of memory cell strings, and a plurality of serially connected non-volatile memory cells; a voltage generator configured to generate a program verification voltage and a read voltage applied to the plurality of word lines; and a control circuit configured to control a compensation for the program verification voltage based on a program verification temperature offset, and control a compensation for the read voltage based on a read temperature offset. The plurality of word lines may be divided into a plurality of word line groups including two or more word lines, and the control circuit may set a program verification temperature offset and a read temperature offset in a corresponding word line group among the plurality of word line groups according to a distance between one word line in each of the plurality of word line groups and the substrate and an operation temperature.

Yet another embodiment provides a non-volatile memory device, including: a memory cell array including a plurality of word lines including first and second word lines; a voltage generator configured to generate a program verification voltage to be applied to the plurality of word lines during a program verification and a read voltage to be applied to the plurality of word lines during a data read, and a control circuit configured to generate a verification offset for compensating for the verification voltage based on a temperature during the program verification and a position of a word line, to which the verification voltage is to be applied, generate a read offset for compensating for the read voltage based on a temperature during the data read and a position of a word line, to which the read voltage is to be applied, and control a directionality between the two offsets. The plurality of word lines may be divided into a plurality of word line groups including word lines having the number based on an operation temperature, the control circuit may set a verification offset and a read offset in a corresponding word line group among the plurality of word line groups according to a position of one word line in each of the plurality of word line groups and an operation temperature, and each of the first word line and the second word line may belong to a different word line group.

According to the exemplary embodiments, it is possible to improve reliability of a non-volatile memory device by variably compensating a change in a threshold voltage of a memory cell by a temperature change according to a distance between a memory cell and a ground selection transistor.

BRIEF DESCRIPTION OF THE DRAWINGS

FIG. 16B is a diagram describing a compensation for a program verification voltage for each word line group according to an exemplary embodiment.

FIG. 30 is a diagram describing a memory system according to an exemplary embodiment.

DETAILED DESCRIPTION OF THE EMBODIMENTS

Figure 1:
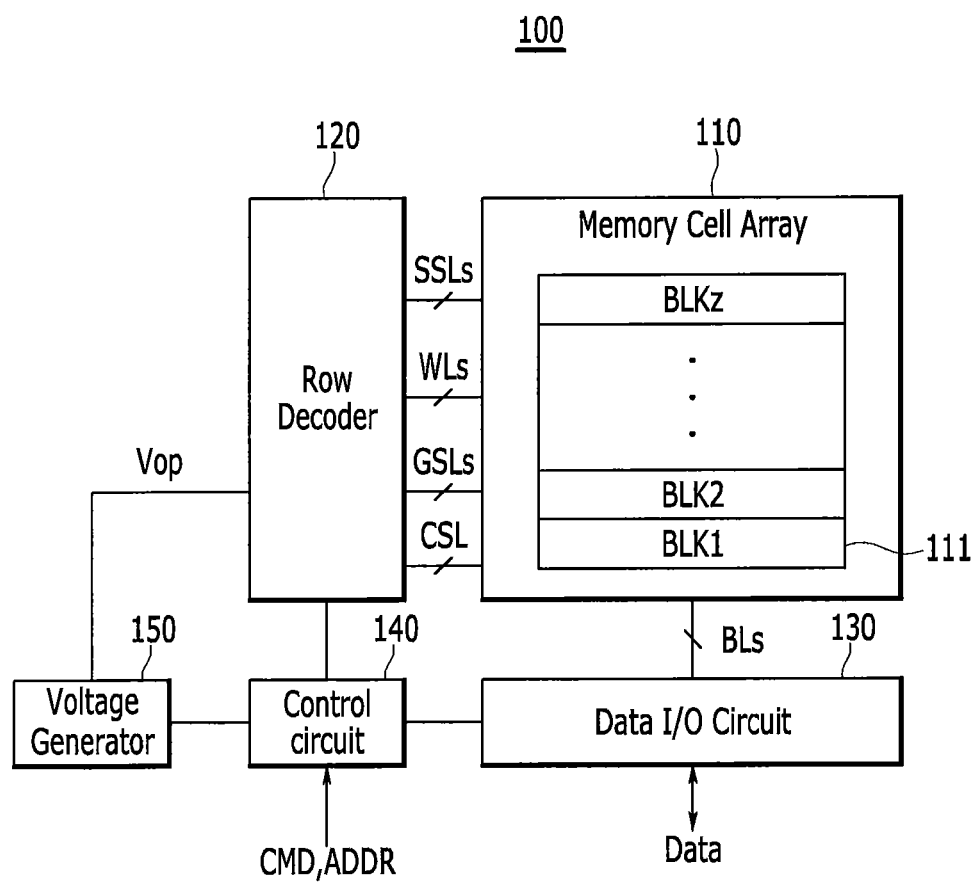
FIG. 1 is a diagram describing a non-volatile memory device.

In the following detailed description, only certain exemplary embodiments of the present invention have been shown and described, simply by way of illustration . As those skilled in the art would realize, the described embodiments may be modified in various different ways, all without departing from the spirit or scope of the present invention . Accordingly, the drawings and description are to be regarded as illustrative in nature and not restrictive. Like reference numerals designate like elements throughout the specification .

FIG. 1 is a diagram describing a non-volatile memory device.

Referring to FIG. 1, a non-volatile memory device 100 includes a memory cell array 110, a row decoder 120, a data input/output (I/O) circuit 130, a control logic 140, and a voltage generator 150.

The memory cell array 110 may include a plurality of memory blocks BLK1 to BLKz. The memory blocks may be connected to the row decoder 120 through word lines WLs, string selection lines SSLs, ground selection lines GSLs, and a common source line. The memory cell array 110 may be connected to the data I/O circuit 130 through the bit lines BLs.

The memory cell array 110 may be a 2D memory cell array in which a plurality of memory cells is two-dimensionally formed on a substrate. Otherwise, the memory cell array 110 may be a 3D memory cell array in which a plurality of memory cells is laminated on a substrate in a vertical direction. Each of the memory cells of the memory cell array 110 may be a single level cell (SLC), in which 1 bit is stored in one cell. Otherwise, each of the memory cells may be a multi-level cell (MLC), in which 2 bits or more are stored in one cell.

The voltage generator 150 may generate operation voltages Vop required for an operation of the row decoder 120 in response to a control of the circuit logic 140. For example, during a program operation, the voltage generator 150 may generate a program voltage, a program pass voltage, a program verification voltage, and a program verification pass voltage in response to the control of the control logic 140, and provide the generated operation voltages to the row decoder 120. As another example, during a read operation, the voltage generator 150 may generate a read voltage and a read pass voltage in response to the control of the control logic 140, and provide the generated operation voltages to the row decoder 120.

In each example, the row decoder 120 may selectively apply the received operation voltages to the word lines WLs according to the control of the control logic 140. Further, the voltage generator 150 may generate voltages applied to the string selection lines SSLs, the ground selection lines GSLs, and the common source line CSL during the program and read operation in response to the control of the control logic 140, and provide the generated voltage to the row decoder 120.

The row decoder 120 may select any one of the plurality of word lines connected to the memory cell array 110 in response to an address (ADDR) control logic received from the outside or generated in the non-volatile memory device. The row decoder 120 may receive the operation voltage from the voltage generator 150, and transmit the received operation voltage to the selected word line.

During the program operation, the row decoder 120 may select one word line, and transmit a program voltage and/or a program verification voltage PV to the selected word line (Selected WL).

The row decoder 120 may transmit a program pass voltage to unselected word lines (Unselected WLs) during the transmission of the program voltage to the selected word line. Further, the row decoder 120 may transmit a program verification pass voltage to unselected word lines during the transmission of the program verification voltage to the selected word line.

During the read operation, the row decoder 120 may select one word line, and transmit a read voltage to the selected word line. Further, the row decoder 120 may transmit a read pass voltage to unselected word lines.

The data I/O circuit 130 may receive data DATA from the outside, and store the received data in the memory cell array 110 through the bit lines BLs. Further, the data I/O circuit 130 may receive the data DATA stored in the memory cell array 110 through the bit lines BLs, and output the received data to the outside. The data I/O circuit 130 may include a page buffer. The present invention is not limited thereto, and the page buffer may also be formed outside the data I/O circuit 130.

The control logic 140 receives a command CMD and an address ADDR from the outside, and controls general read, program, and erase operations of the non-volatile memory device 100. For example, the control logic 140 receives a program command from the outside, and controls a general program operation of the non-volatile memory device 100. As another example, the control logic 140 receives a read command from the outside, and controls a general read operation of the non-volatile memory device 100.

Each of the memory blocks 111 may be independently connected to the plurality of word lines WLs, one or more string selection lines SSLs, and one or more ground selection lines GSLs. For example, a first memory block BLK1 may be connected to first word lines, a first string selection line, and a first ground selection line, and a second memory block BLK2 may be connected to second word lines, a second string selection line, and a second ground selection line. When the first memory block is selected, a selection voltage may be applied to the first string selection line and the first ground selection line. In this case, when the second memory block is not selected, a non-selected voltage may be applied to the second string selection line and the second ground selection line. The common source line CSL may be commonly connected to the plurality of memory blocks included in the memory cell array 110.

Figure 2:
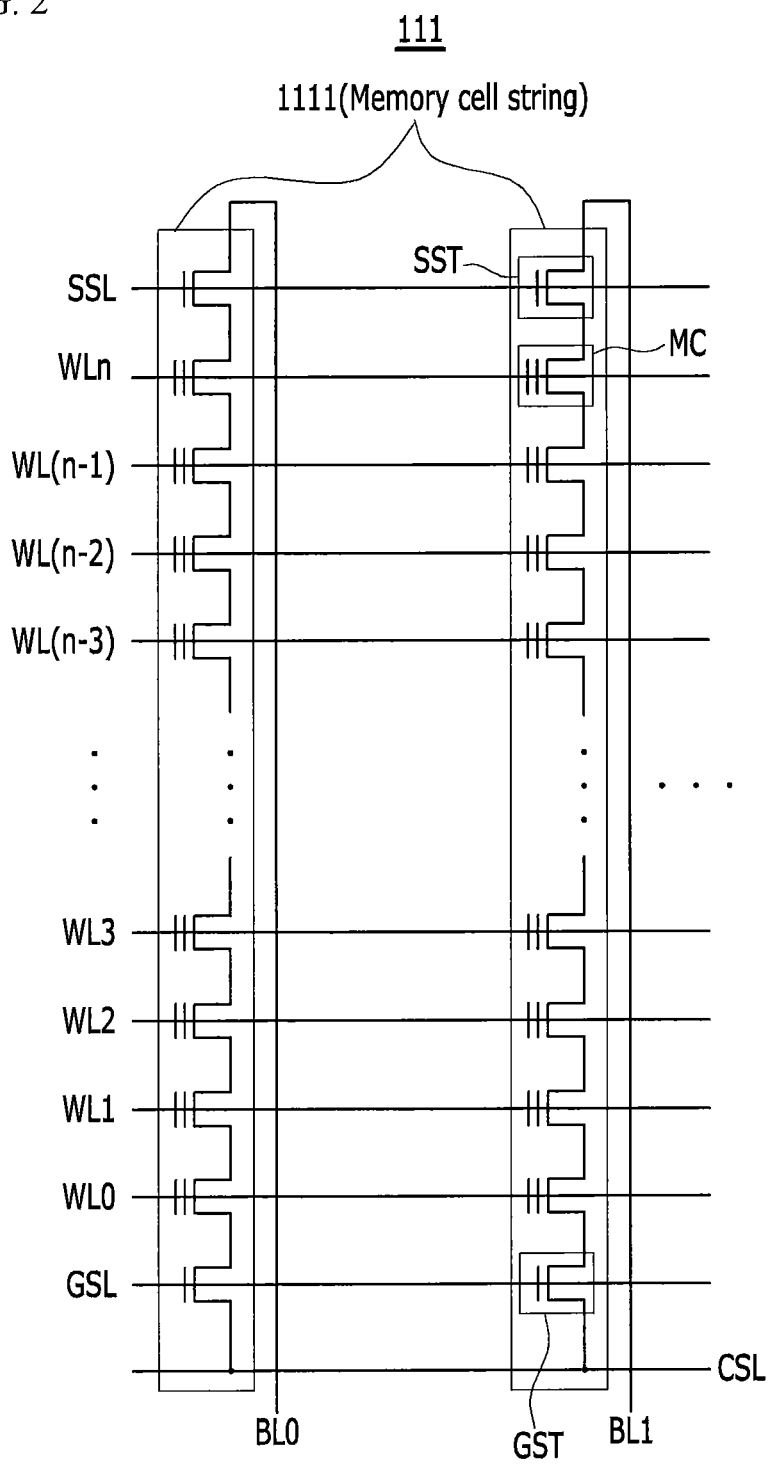
FIG. 2 is a diagram describing a memory block of FIG. 1 according to an exemplary embodiment in detail.

FIG. 2 is a diagram describing the memory block of FIG. 1 according to the exemplary embodiment in detail.

Referring to FIG. 2, the memory block 111 may include a plurality of memory cell strings 1111. Further, each of the memory cell strings may include a plurality of serially connected memory cells MC, and may be connected to a corresponding bit line BL. Each of the memory cell strings may include one string selection transistor SST between the plurality of serially connected memory cells MC and the bit line BL. Further, each of the memory cell strings may include two or more serially connected string selection transistors SSTs between the plurality of serially connected memory cells MC and the bit line BL. Each of the memory cell strings may include one ground selection transistor GST between the plurality of serially connected memory cells MC and the common source line CSL. Further, each of the memory cell strings may also include two or more serially connected ground selection transistors GSTs between the plurality of serially connected memory cells MC and the common source line.

The plurality of memory cell strings included in the memory block may share the word lines WL0 to WLn, the string selection line SSL, and the ground selection line GSL. A group of the memory cells connected to one word line is referred to as a physical page, and one physical page may store one logic page in a case of the single level cell SLC. Further, one physical page may store two or more logic pages in a case of the multi-level cell MLC.

Figure 3:
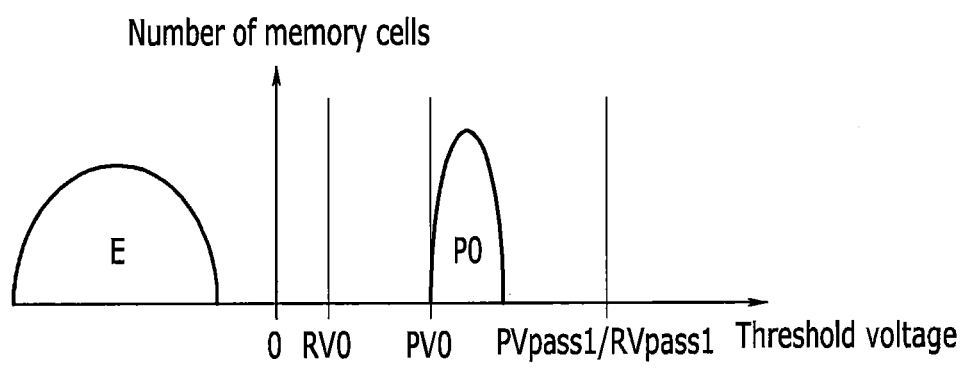
FIG. 3 is a diagram describing threshold voltage distributions of a single level cell SLC and a multi-level cell MLC according to an exemplary embodiment.
Figure 3:
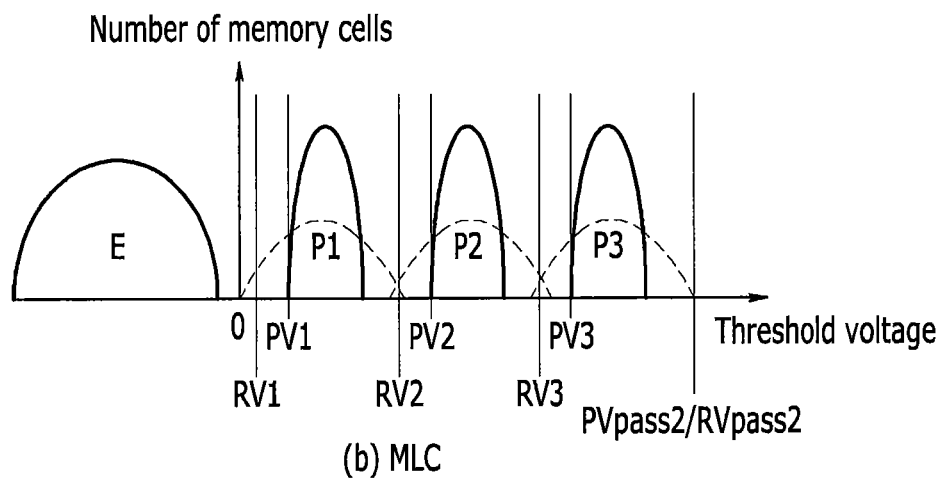

FIG. 3 is a diagram describing threshold voltage distributions of the single level cell SLC and the multi-level cell MLC according to the exemplary embodiment.

The case of the single level cell represents a threshold voltage distribution of the memory cells when one logic page is stored in one physical page. The threshold voltage distribution of the memory cells included in one physical page in the case of the single level cell may be formed of one erase distribution E and one program distribution P0. The program distribution P0 may be formed by performing a verification operation in a state where a program verification voltage PV0 is applied to a selected word line, and a first program pass voltage PVpass1 is applied to unselected word lines. Further, stored data may be read in a state where a read voltage RV0 is applied to the selected word line and a first read pass voltage RVpass1 is applied to the unselected word line. The first program pass voltage PVpass1 may be a voltage which is the same as or different from the first read pass voltage RVpass1.

The case of the multi-level cell represents a threshold voltage distribution of the memory cells when two logic pages are stored in one physical page. The threshold voltage distribution of the memory cells included in one physical page in the case of the multi-level cell may be formed of one erase distribution E and three program distributions P1, P2, and P3. The first program distribution P1 may be formed by performing a program verification operation in a state where a first program verification voltage PV1 is applied to a selected word line, and a second program pass voltage PVpass2 is applied to unselected word lines. The second program distribution P2 may be formed by performing a program verification operation in a state where a second program verification voltage PV2 is applied to the selected word line, and the second program pass voltage PVpass2 is applied to the unselected word lines. Further, the third program distribution P3 may be formed by performing a program verification operation in a state where a third program verification voltage PV3 is applied to a selected word line, and the second program pass voltage PVpass2 is applied to the unselected word lines.

Further, two elements of logic page data stored in the physical page may be read in a state where a plurality of read voltages RV1, RV2, and RV3 is applied to the selected word line, and the second read pass voltage RVpass2 is applied to the unselected word line. The second program pass voltage PVpass2 may be a voltage which is the same as or different from the second read pass voltage RVpass2. Further, the first read pass voltage RVpass1 may be a voltage which is the same as or different from the second read pass voltage RVpass2.

Figure 4:
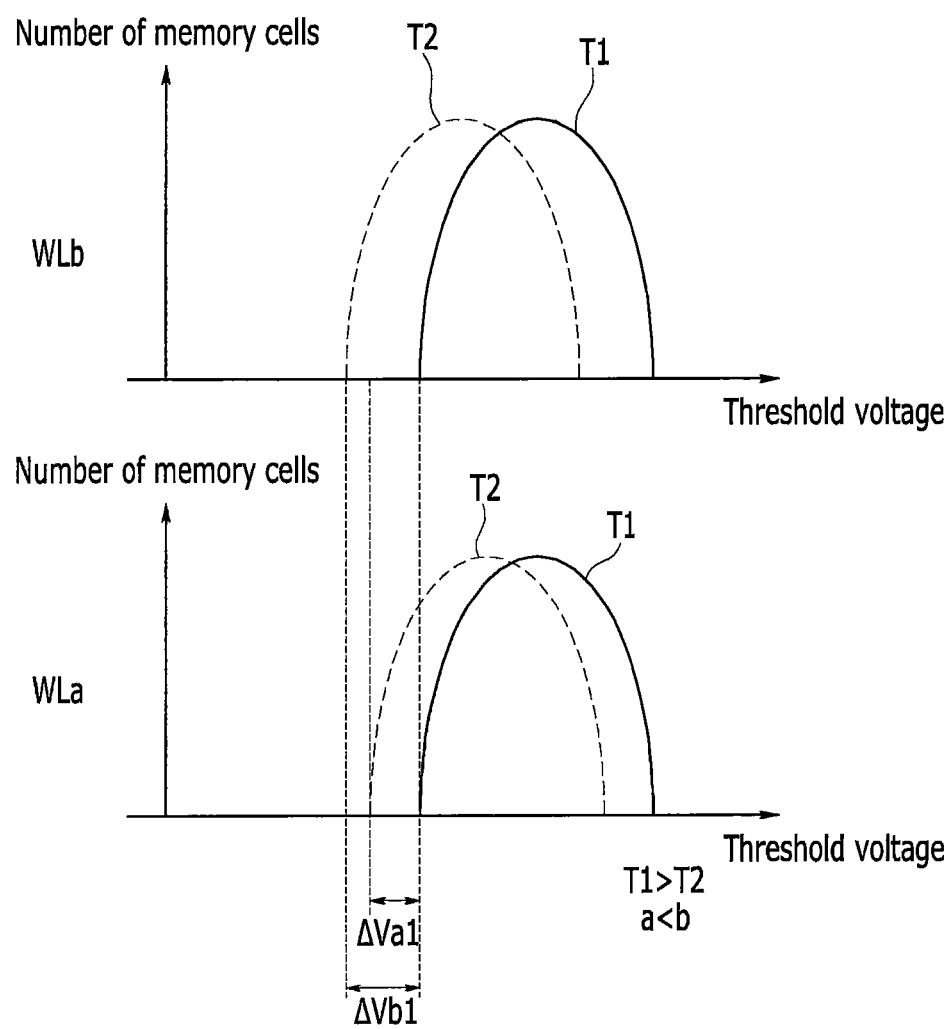
FIG. 4 is a diagram describing a change in a threshold voltage distribution of memory cells according to a change in a temperature according to an exemplary embodiment.

FIG. 4 is a diagram describing a change in a threshold voltage distribution of memory cells according to a change in a temperature according to an exemplary embodiment.

Referring to FIG. 4, a threshold voltage of the memory cell may be changed according to a temperature. For example, when a temperature is high, the threshold voltage may be increased as illustrated in FIG. 4. As a result, when a temperature is high, a threshold voltage distribution of the memory cells included in one physical page may move in a right direction.

Further, contrary to this, when a temperature is high, the threshold voltage may be dropped. In this case, when a temperature is high, a threshold voltage distribution of the memory cells included in one physical page may move in a left direction. The difference may result from a sensing operation condition during the read operation or the program operation. Accordingly, in the description of the exemplary embodiment below, a direction of a compensation for a read voltage and a program compensation verification voltage according to a change in a temperature may be changed according to directionality of a change in a threshold voltage according to a temperature.

A change in a threshold voltage according to a temperature of a memory cell may be different according to a position of the memory cell within the memory cell string. A word line a WLa is positioned to be closer to the ground selection line GSL than a word line b WLb. That is, the number of memory cells connected between a memory cell connected to the word line b WLb and the ground selection transistor GST is larger than the number of memory cells connected between a memory cell connected to the word line a WLa and the ground selection transistor GST.

A movement ΔVb1 of a threshold voltage distribution according to a temperature of the memory cells connected to the word line b WLb may be larger than a movement ΔVa1 of a threshold voltage distribution according to a temperature of the memory cells connected to the word line a WLa. That is, when the number of memory cells connected between the selected memory cell and the ground selection transistor GSL is large, a movement of the threshold voltage according to a temperature may be large. The reason is that a change in channel resistance of a source side of the selected memory cell further influences on the change in the threshold voltage of the selected memory cell than a change in channel resistance of a drain side of the selected memory cell.

As a result, when a distance between the selected memory cell within the memory cell string and the ground selection transistor is large, a change in the threshold voltage of the selected memory cell according to a temperature may be further increased. Accordingly, when the program verification is performed by using the same program verification voltage or the read operation is performed by using the same read voltage regardless of a position of a selected memory cell, reliability of the non-volatile memory device may be degraded.

Figure 5:
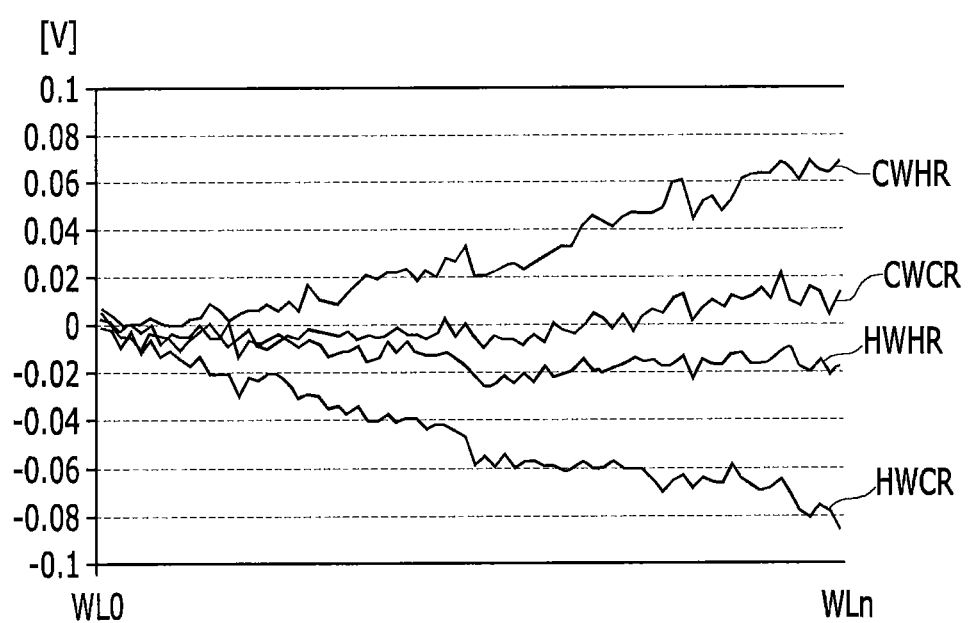
FIG. 5 is a diagram illustrating a change in a threshold voltage of memory cells according to a temperature during a program and a temperature during a read according to an exemplary embodiment.

FIG. 5 is a diagram illustrating a change in a threshold voltage of memory cells according to a temperature during a program and a temperature during a read according to an exemplary embodiment.

FIG. 5 represents that when a temperature during a program verification is different from a temperature during a read, a movement of a threshold voltage distribution is different according to a position of a selected word line within a selected memory block.

An x-axis of FIG. 5 represents a position within a memory block of a selected word line, that is, a distance between the selected word line and a ground selection line, and a y-axis represents a degree of movement of a threshold voltage distribution based on a word line 0 WL0.

In a case where a program verification is performed at a low temperature and a read operation is performed at a high temperature (CWHR), when the selected word line is far from the ground selection line, a movement of the threshold voltage distribution tends to be increased in a positive direction. In a case where a program verification is performed at a low temperature and a read operation is performed at the same low temperature (CWCR), or a program verification is performed at a high temperature and a read operation is performed at the same high temperature (HWHR), it can be seen that the threshold voltage distribution is less related to a distance between the selected word line and the ground selection line. Further, in a case where a program verification is performed at a high temperature and a read operation is performed at a low temperature (HWCR), when the selected word line is far from the ground selection line, a movement of the threshold voltage distribution tends to be increased in a negative direction.

The deviation of the threshold voltage distribution illustrated in FIG. 5 is an example for the description. The tendency that the threshold voltage distribution is increased in the negative direction or the positive direction may be reverse to the illustration of FIG. 5. Hereinafter, the exemplary embodiment has been described based on the tendency of the threshold voltage distribution illustrated in FIG. 5, but the present invention is not limited thereto.

When the number of serially connected memory cells within the memory cell string is increased, a difference in the change in the threshold voltage according to a change in a temperature between a memory cell close to the ground selection transistor and a memory cell close to the string selection transistor may be further increased. Accordingly, when the number of serially connected memory cells within the memory cell string is increased, a need to variably apply a temperature compensation according to a position of a word line is increased. For example, there may be a case where the number of serially connected memory cells within the memory cell string is 70 or more.

Figure 6:
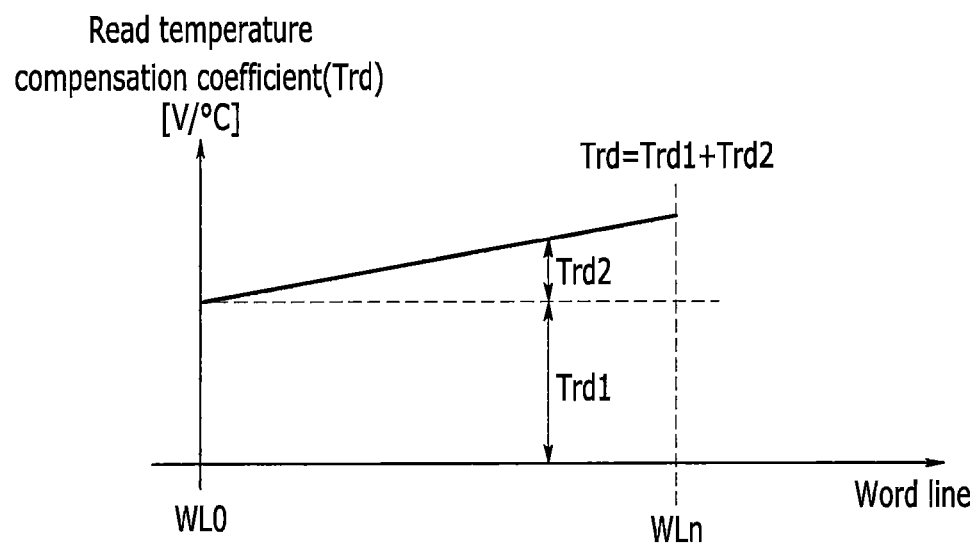
FIG. 6 is a diagram describing the setting of a read temperature compensation coefficient according to an exemplary embodiment.

FIG. 6 is a diagram describing the setting of a read temperature compensation coefficient according to an exemplary embodiment.

A read temperature compensation coefficient Trd is a coefficient representing an offset of a read voltage according to a unit temperature change during a read operation in order to compensate for a change in a threshold voltage of each memory cell within the memory cell string according to a temperature change during the read operation. When a threshold voltage of the memory cell is increased according to an increase in a temperature, and thus it is necessary to increase a read voltage, the read temperature compensation coefficient Trd may have a positive value. Contrary to this, when a threshold voltage of the memory cell is dropped according to an increase in a temperature, and thus it is necessary to drop a read voltage, the read temperature compensation coefficient Trd may have a negative value. For example, when it is assumed that when a temperature is increased by 1° C., a threshold voltage is increased by 1 mV, the read temperature compensation coefficient Trd is 1 mV/° C. By contrast, when it is assumed that when a temperature is dropped by 1° C., a threshold voltage is dropped by 1 mV, the read temperature compensation coefficient Trd is −1 mV/° C.

The read temperature compensation coefficient Trd may be represented with a sum of a first read temperature compensation coefficient Trd1 for compensating for a threshold voltage movement generated regardless of a distance between the selected word line and the ground selection line, and a second read temperature compensation coefficient Trd2 representing a threshold voltage movement differently generated according to a distance between the selected word line and the ground selection line based on the word line 0 WL0 closest to the ground selection line.

The second read temperature compensation coefficient Trd2 may have a large positive value when the distance between the selected word line and the ground selection line is increased, that is, a distance between the ground selection transistor and a selected memory cell is increased. The reason is that as described above, in a change of a channel resistance by an unselected memory cell, a change in channel resistance of a source side of the selected memory cell further influences on the change in the threshold voltage of the selected memory cell.

The second read temperature compensation coefficient Trd2 is different between a case where the memory cell is the single level cell and a case where the memory cell is the multi-level cell. For example, the second read voltage temperature compensation coefficient of the single level cell may be larger or smaller than the second read voltage temperature compensation coefficient of the multi-level cell.

This may result from a difference between a position of a program threshold voltage distribution of the single level cell and a position of a program threshold voltage distribution of the multi-level cell, and may also result from a difference between the first read pass voltage VRpass1 of the single level cell and the second read pass voltage VRpass2 of the multi-level cell. For example, when the first read pass voltage VRpass1 of the single level cell is varied, the second read temperature compensation coefficient Trd2 may be varied. The reason is that channel resistance of the unselected memory cells may be varied by the variation of the first read pass voltage VRpass1.

When the memory cell is the multi-level cell, the first read temperature compensation coefficient Trd1 and the second read temperature compensation coefficient Trd2 of each of a first read voltage VR1, a second read voltage VR2, and a third read voltage VR3 may be differently applied. The reason is that a different threshold voltage change according to a temperature may be present according to a position of the threshold voltage distribution. Further, when the second read pass voltage VRpass2 of the multi-level cell is varied, the second read temperature compensation coefficient Trd2 of each of the first read voltage VR1, the second read voltage VR2, and the third read voltage VR3 may be varied.

The read pass voltage applied to an unselected word line during the read operation may also be varied according to a temperature. A temperature compensation coefficient of the read pass voltage applied to the unselected word line during the read operation may be smaller than a read temperature compensation coefficient of the selected word line.

A threshold voltage of each of the string selection transistor SST and the ground selection transistor GST within the memory cell string may be changed according to a temperature. For example, when a temperature is increased, the threshold voltage may be increased, and in contrast to this, when a temperature is increased, the threshold voltage may be decreased. In order to compensate for the variation of the threshold voltage, a voltage applied to the string selection line SSL or the ground selection line GSL during the read operation may be varied according to a temperature. A read temperature compensation coefficient of the voltage applied to the string selection line SSL or a read temperature compensation coefficient of the voltage applied to the ground selection line GSL may be smaller than a read temperature compensation coefficient of the voltage applied to the selected word line. Further, a read temperature compensation coefficient of the voltage applied to the string selection line SSL or a read temperature compensation coefficient of the voltage applied to the ground selection line GSL may be equal to or smaller than a temperature compensation coefficient of the read pass voltage applied to the unselected word line during the read operation.

Figure 7:
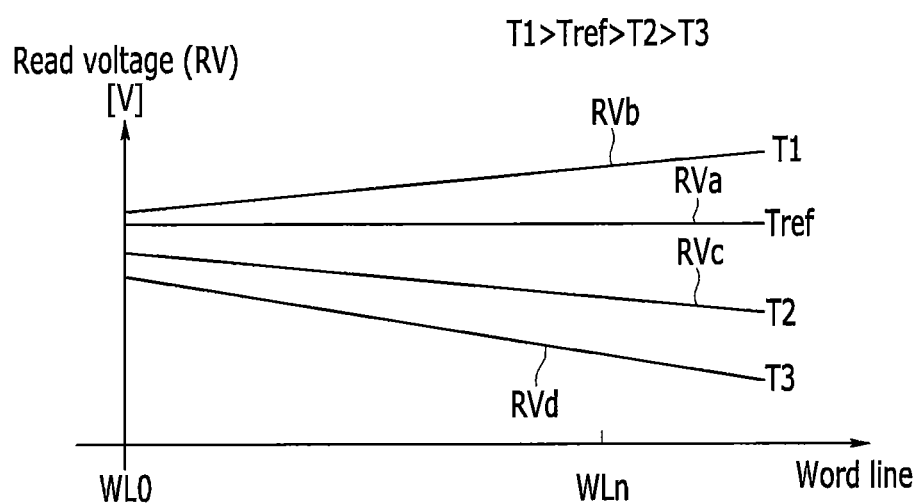
FIG. 7 is a diagram describing a compensation for a read voltage according to an exemplary embodiment.

FIG. 7 is a diagram describing a compensation for a read voltage according to an exemplary embodiment.

FIG. 7 illustrates a method of compensating for a read voltage according to a temperature when the first read temperature compensation coefficient is a positive value and the second read temperature compensation coefficient is a positive value as illustrated in FIG. 6.

First, a read voltage RVa may be uniform regardless of a distance between the selected word line and the ground selection line at a reference temperature Tref. When a temperature T1 during the read operation is higher than the reference temperature Tref, a read voltage RVb may be compensated to be a higher voltage when a distance between a selected word line and the ground selection line is increased, that is, a distance between the ground selection transistor and a selected memory cell is increased. A difference between a and b in the word line 0 WL0 is a result of the read voltage compensation based on the first read temperature compensation coefficient of FIG. 6.

When a temperature T2 during the read operation is lower than the reference temperature Tref, a read voltage RVc may be compensated to be a lower voltage when a distance between a selected word line and the ground selection line is increased, that is, a distance between the ground selection transistor and a selected memory cell is increased. A difference between a and c in the word line 0 WL0 is a result of the read voltage compensation based on the first read temperature compensation coefficient of FIG. 6.

When a temperature T3 is lower than the temperature T2 during the read operation, a variation of a read voltage RVd according to a distance between a selected word line and the ground selection line may be more sharply decreased than the temperature T2. That is, when a difference between the reference temperature Tref and the read temperature is increased, an offset applied to the read voltage according to a position of the word line may be further increased.

The reference temperature Tref may be a highest temperature within a temperature range in which an operation of the non-volatile memory device is reliable. For example, when a temperature range, in which an operation of the non-volatile memory device is reliable, is set with −40 to 85° C., the reference temperature Tref may be set with 85° C. In this case, the temperature compensation is performed on only to a lower temperature than the reference temperature, so that it is possible to decrease complexity in implementing a circuit. In contrast to this, the reference temperature Tref may be a lowest temperature within a temperature range in which an operation of the non-volatile memory device is reliable.

Further, when a movement direction of the threshold voltage distribution according to a temperature is reverse, the read voltage may be compensated in a reverse direction of the direction of the compensation for the read voltage according to the read temperature illustrated in FIG. 7.

Figure 8:
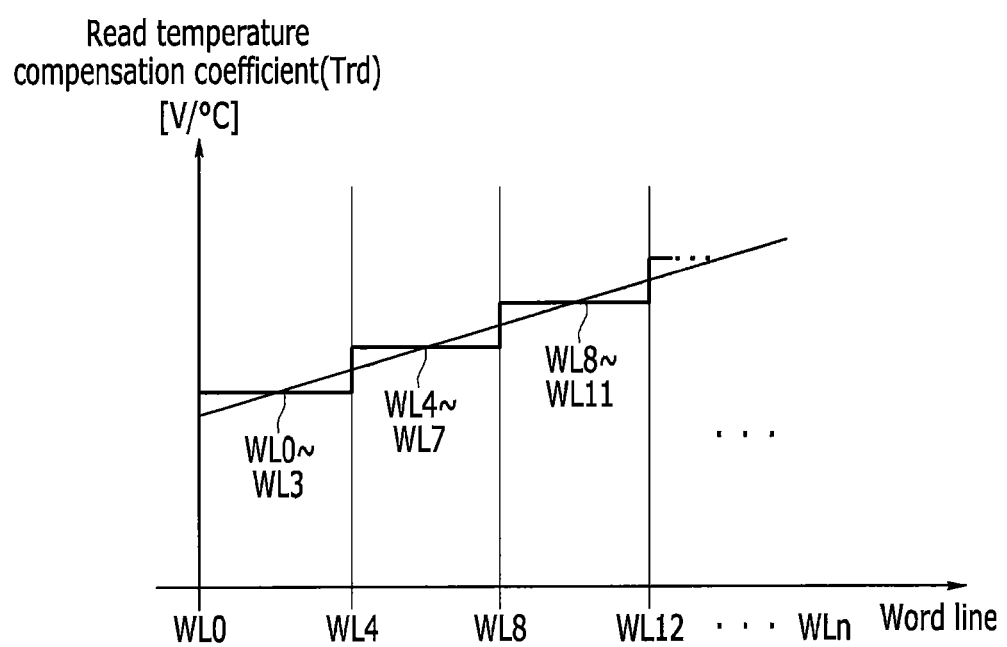
FIG. 8 is a diagram describing a method of setting a read temperature compensation coefficient for each word line group according to an exemplary embodiment.

FIG. 8 is a diagram describing a method of setting a read temperature compensation coefficient for each word line group according to an exemplary embodiment.

When a different read temperature compensation coefficient is applied to each word line in a temperature compensation for a read voltage based on a position of a selected word line, the implementation of a circuit may become very complex. Accordingly, the same read temperature compensation coefficient may be applied by grouping the predetermined number of adjacent word lines into one word line group as illustrated in FIG. 8. A case of FIG. 8 is an example, in which four word lines are grouped into one group, and the same read temperature compensation coefficient is applied to the four word lines included in the same group. As a result, there is an advantage in that complexity is decreased in implementing a circuit. Further, when the number of word lines included in one group is increased, complexity in implementing a circuit may be further decreased.

As illustrated in FIG. 8, in each of the plurality of word line groups WL0 to WL3, WL4 to WL7, WL8 to WL11 . . . , the read temperature compensation coefficient for one word line may be applied to the entire word line group in which the corresponding word line is included.

Figure 9A:
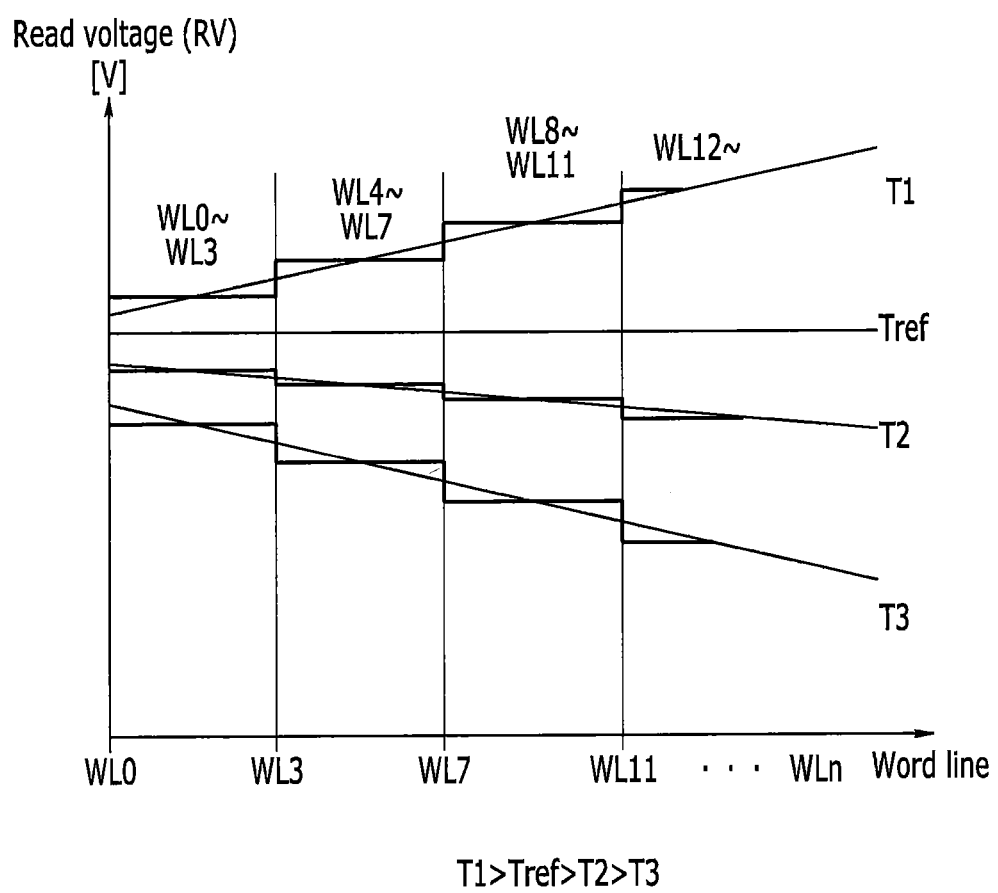
FIG. 9A is a diagram describing a compensation for a read voltage for each word line group according to an exemplary embodiment.

FIG. 9A is a diagram describing a compensation for a read voltage for each word line group according to an exemplary embodiment.

When the same read temperature compensation coefficient is applied for each word line group as described with reference to FIG. 8, a read voltage may be generated and compensated as illustrated in FIG. 9A. This may decrease complexity in implementing a circuit and a size of a memory device as described with reference to FIG. 8.

FIG. 9A illustrates that the number of word lines for each word line group at each of temperatures T1, T2, and T3 is the same, but the present invention is not limited thereto. The number of word lines for each word line group may be different according to the temperatures T1 to T3.

Figure 9B:
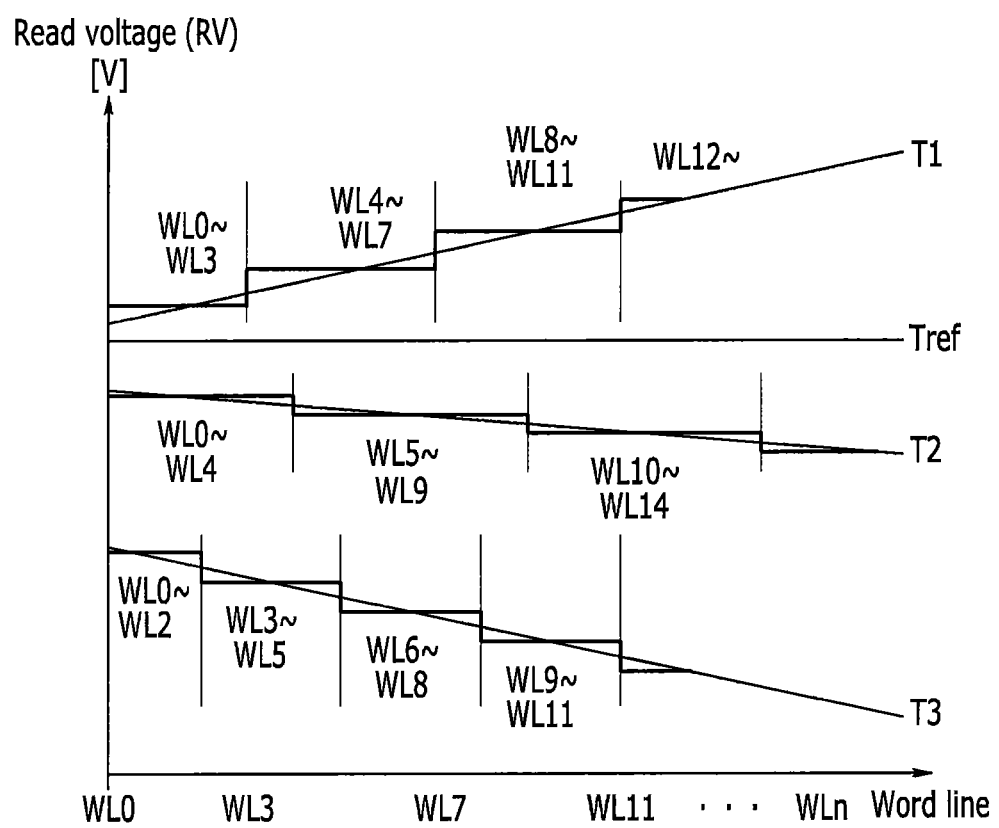
FIG. 9B is a diagram describing a compensation for a read voltage for each word line group according to an exemplary embodiment.

FIG. 9B is a diagram describing a compensation for a read voltage for each word line group according to an exemplary embodiment.

As illustrated in FIG. 9B, the number of word lines for each word line group at the temperature T1 may be set to four, the number of word lines for each word line group at the temperature T2 may be set to five, and the number of word lines for each word line group at the temperature T3 may be set to three. The number of word lines for each word line group may be changed in consideration of a degree of change in the read voltage RV according to the positions of the word lines WL0 to WLn according to a temperature during the read operation.

Figure 10:
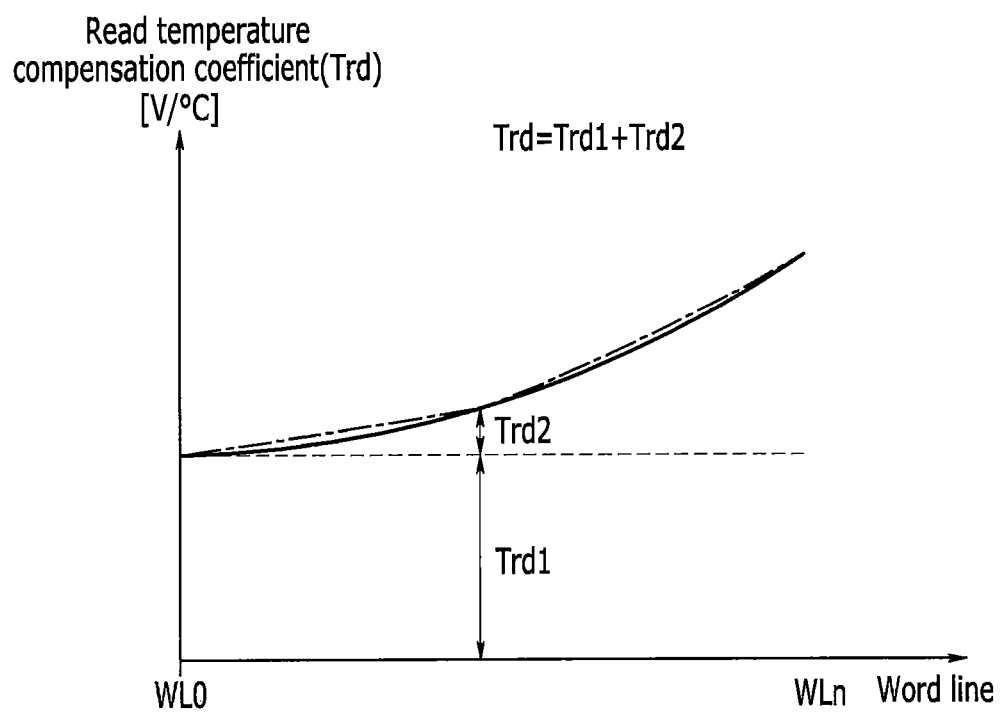
FIG. 10 is a diagram describing the setting of a read temperature compensation coefficient according to an exemplary embodiment.

FIG. 10 is a diagram describing the setting of a read temperature compensation coefficient according to an exemplary embodiment.

A size of a threshold voltage change of the memory cell according to a distance between a selected memory cell and the ground selection transistor may exhibit a non-linear characteristic. As illustrated in FIG. 10, when a distance between a selected memory cell and the ground selection transistor is increased, the read temperature compensation coefficient may be more sharply increased. As an exemplary embodiment, when a distance between a selected memory cell and the ground selection transistor is increased, the read temperature compensation coefficient may be more gently increased. When the size of the threshold voltage change of the memory cell according to a distance between the selected memory cell and the ground selection transistor exhibits the non-linear characteristic, the read temperature compensation coefficient may be linearly approximated for each word line group and applied as illustrated in FIG. 10. Through the linear approximation, it is possible to decrease complexity in implementing a circuit.

Figure 11:
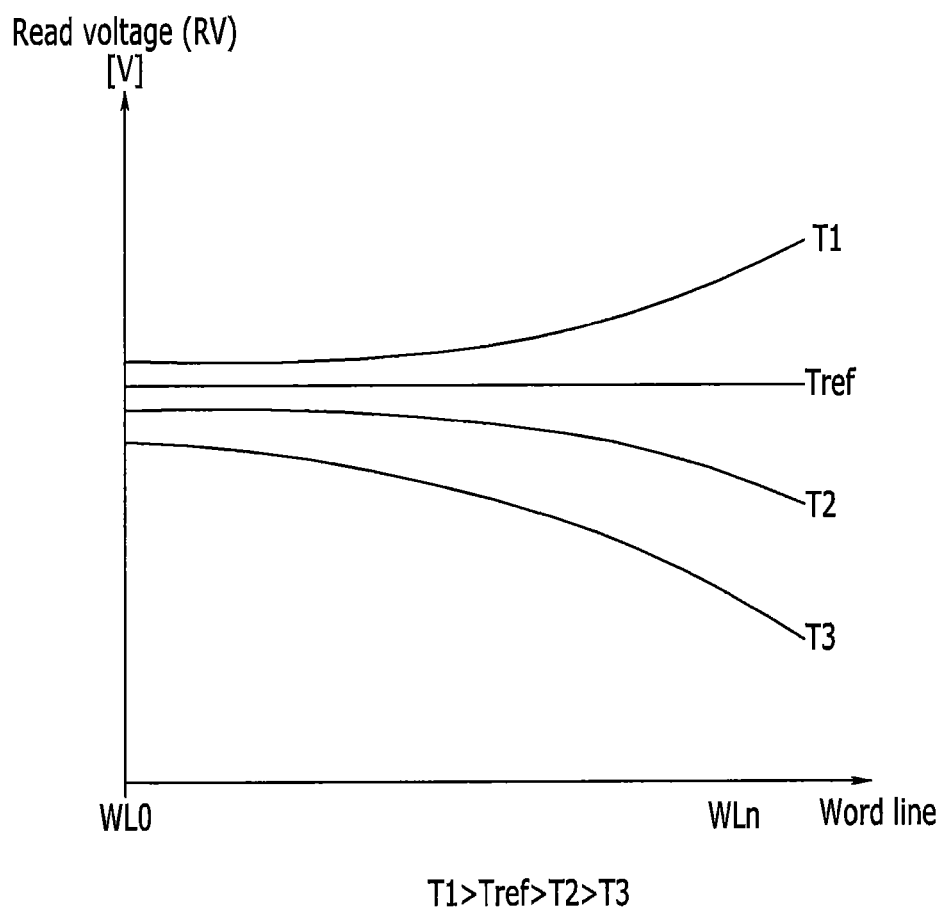
FIG. 11 is a diagram describing a compensation for a read voltage according to an exemplary embodiment.

FIG. 11 is a diagram describing a compensation for a read voltage according to an exemplary embodiment.

FIG. 11 illustrates the setting of a read voltage when the read temperature compensation coefficient exhibits the non-linear characteristic as illustrated in FIG. 10. When a distance between the selected memory cell and the ground selection transistor is increased, the degree of compensating for a read voltage may be sharply increased.

Further, when a movement direction of the threshold voltage distribution according to a temperature is reverse, a read voltage may be compensated in a reverse direction of the direction of the compensation for the read voltage according to the read temperature illustrated in FIG. 11.

Figure 12A:
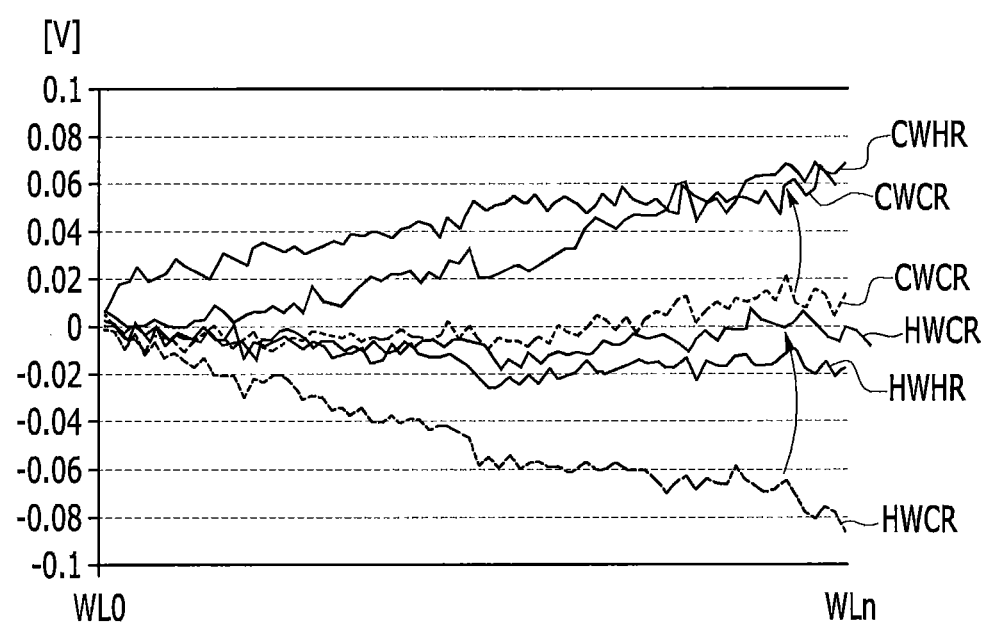
FIGS. 12A and 12B are diagrams conceptually describing a change in a threshold voltage according to a temperature during a program and a temperature during a read after a read voltage is compensated according to an exemplary embodiment.

FIG. 12A is a diagram conceptually describing a change in a threshold voltage according to a temperature during a program and a temperature during a read after a read voltage is compensated according to an exemplary embodiment.

When the change in the threshold voltage according to the temperature change based on the position of the selected word line during the read operation is compensated like the aforementioned method, it is possible to remove the difference in the change of the threshold voltage according to the position of the selected word line with respect to the case (HWCR) where the program verification operation is performed at a high temperature and the read operation is performed at a low temperature as illustrated in FIG. 12A. A threshold voltage distribution deviation (HWHR) when the read operation is performed at a high temperature after the program verification operation at a high temperature and a threshold voltage distribution deviation (CWHR) when the read operation is performed at a high temperature after the program verification operation at a low temperature may be maintained identically to FIG. 5.

However, when the program verification operation is performed at a low temperature and the read operation is performed at a high temperature (CWHR), it is impossible to remove a difference in a change of the threshold voltage according to the position of the selected word line. Further, when the program verification operation is performed at a low temperature and the read operation is performed at a low temperature (CWCR), a difference in a change of the threshold voltage according to the position of the selected word line may be moved from a dot line to a solid line by the compensation during the read operation. Then, even in the program verification operation, it is necessary to compensate for a temperature by the similar method to that of the read operation.

Figure 13:
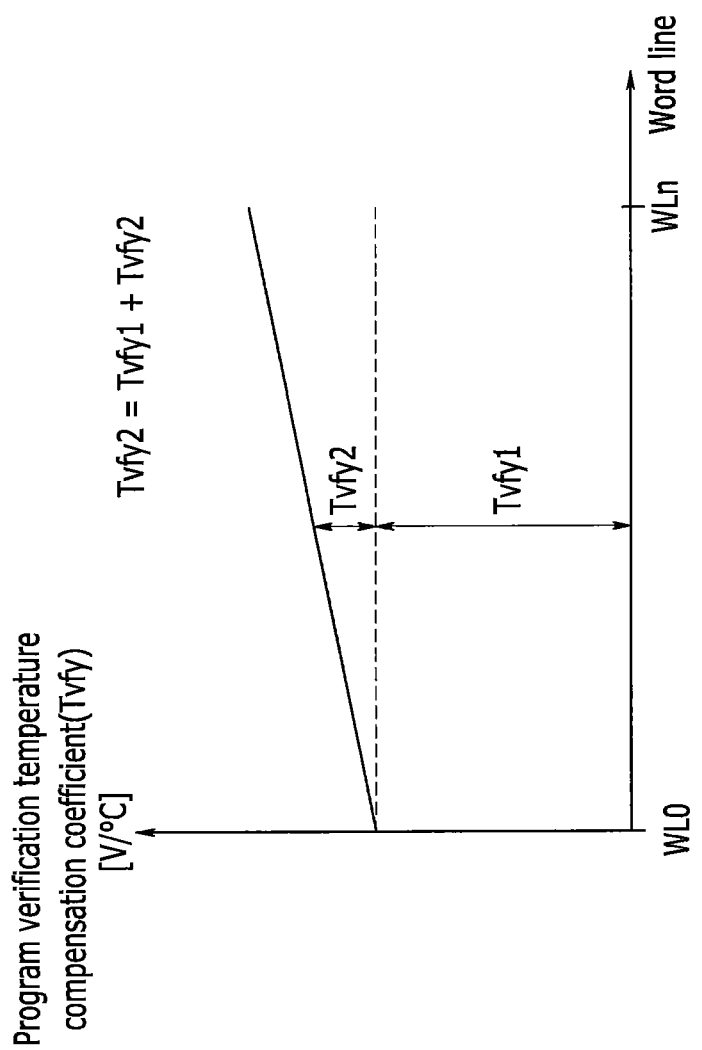
FIG. 13 is a diagram describing the setting of a program verification temperature compensation coefficient according to an exemplary embodiment.

FIG. 13 is a diagram describing the setting of a program verification temperature compensation coefficient according to an exemplary embodiment.

As described with reference to FIG. 12A, even in the program verification operation, it is necessary to compensate for a temperature by a similar method to that of the read operation. A first program verification temperature compensation coefficient Tvfy1 may be set in the same direction as that of the first read temperature compensation coefficient in response to the first read temperature compensation coefficient, but a value thereof may also be the same as or different from that of the first read temperature compensation coefficient. Further, a second program verification temperature compensation coefficient Tvfy2 may be set in the same direction as that of the second read temperature compensation coefficient in response to the second read temperature compensation coefficient, but a value thereof may also be the same as or different from that of the second read temperature compensation coefficient. The reason is that the threshold voltage of an unselected memory cell may be different between the program verification operation and the read operation.

Figure 14:
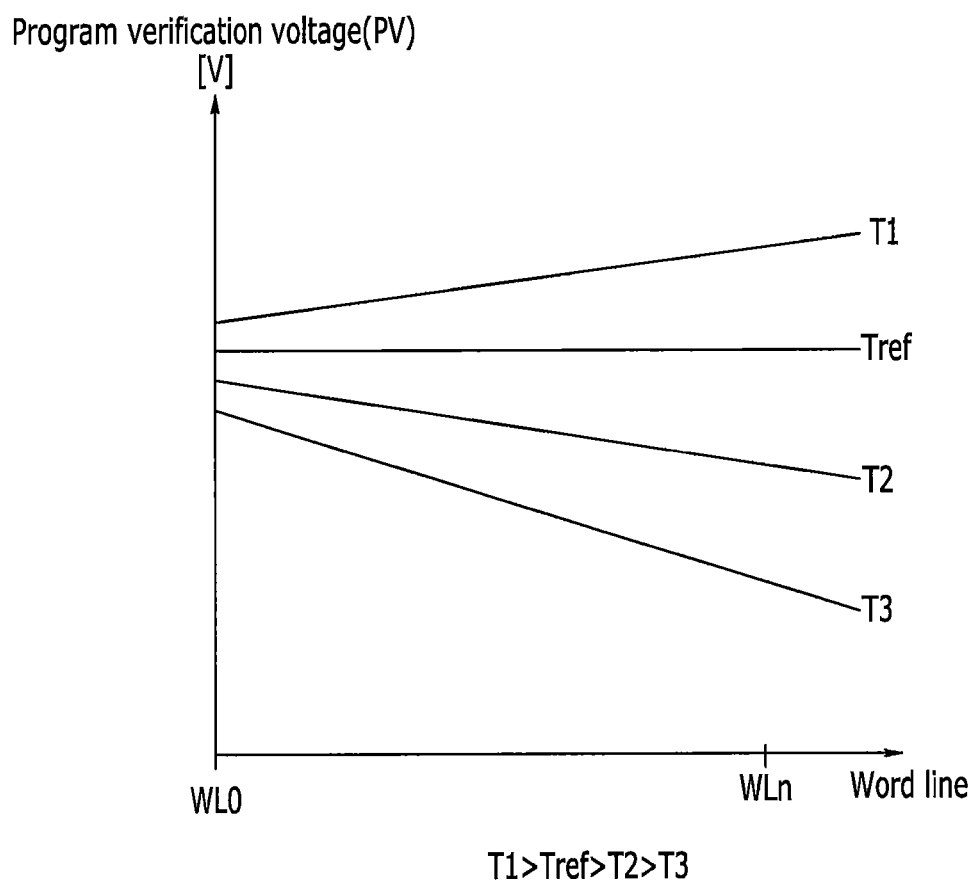
FIG. 14 is a diagram describing a compensation for a program verification voltage according to an exemplary embodiment.

FIG. 14 is a diagram describing a compensation for a program verification voltage according to an exemplary embodiment.

FIG. 14 describes the degree of compensation for a temperature of a program verification voltage according to a distance between the ground selection line and the selected word line, that is, a distance between the ground selection transistor and a selected memory cell when the program verification temperature compensation coefficient is set as illustrated in FIG. 13. This is similar to FIG. 7, so that a detailed description will be omitted.

Further, when a movement direction of the threshold voltage distribution according to a temperature is reverse, a program verification voltage may be compensated in a reverse direction of the direction of the compensation for the program verification voltage according to the program verification temperature illustrated in FIG. 14.

Figure 15:
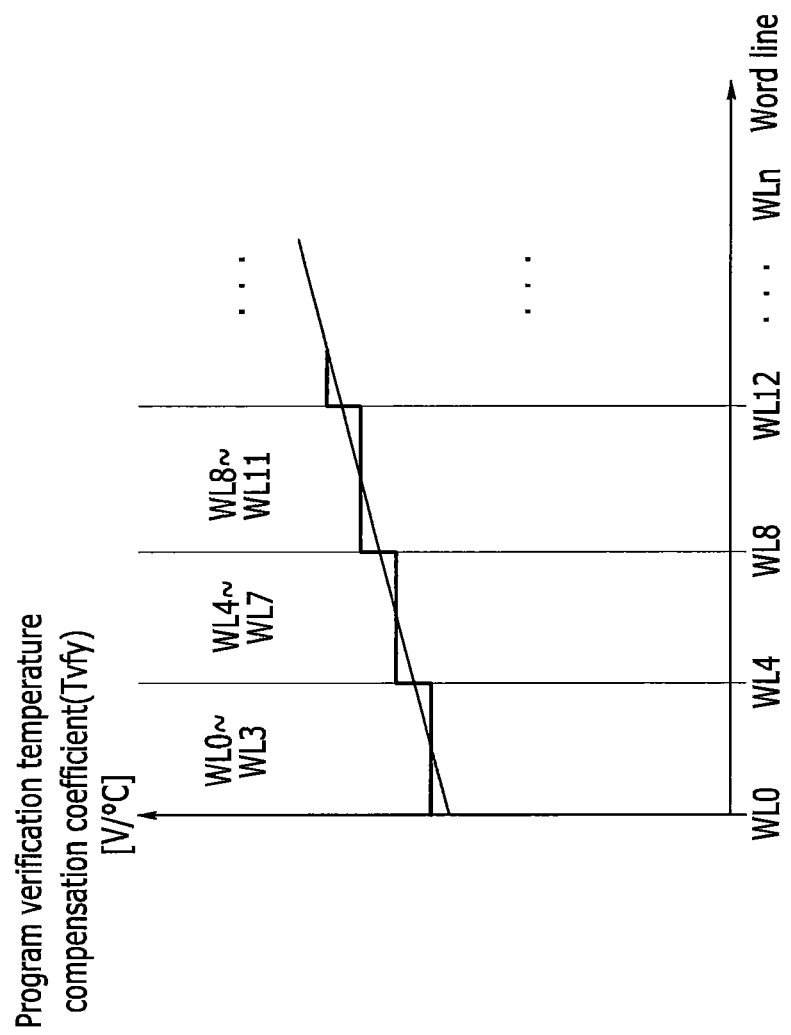
FIG. 15 is a diagram describing a method of setting a program verification temperature compensation coefficient for each word line group according to an exemplary embodiment.

FIG. 15 is a diagram describing a method of setting a program verification temperature compensation coefficient for each word line group according to an exemplary embodiment.

Like the case of FIG. 8, even when the program verification temperature compensation coefficient is set, the same program temperature compensation coefficient may be applied for each word line group including a plurality of word lines in order to decrease complexity in implementing a circuit. The setting of the word line group during the program verification operation may be the same as or different from the setting of the word line group during the read operation.

As illustrated in FIG. 15, in each of the plurality of word line groups WL0 to WL3, WL4 to WL7, WL8 to WL11 . . . , a program verification temperature compensation coefficient for one word line may be applied to an entire word line group in which the corresponding word line is included.

Figure 16A:
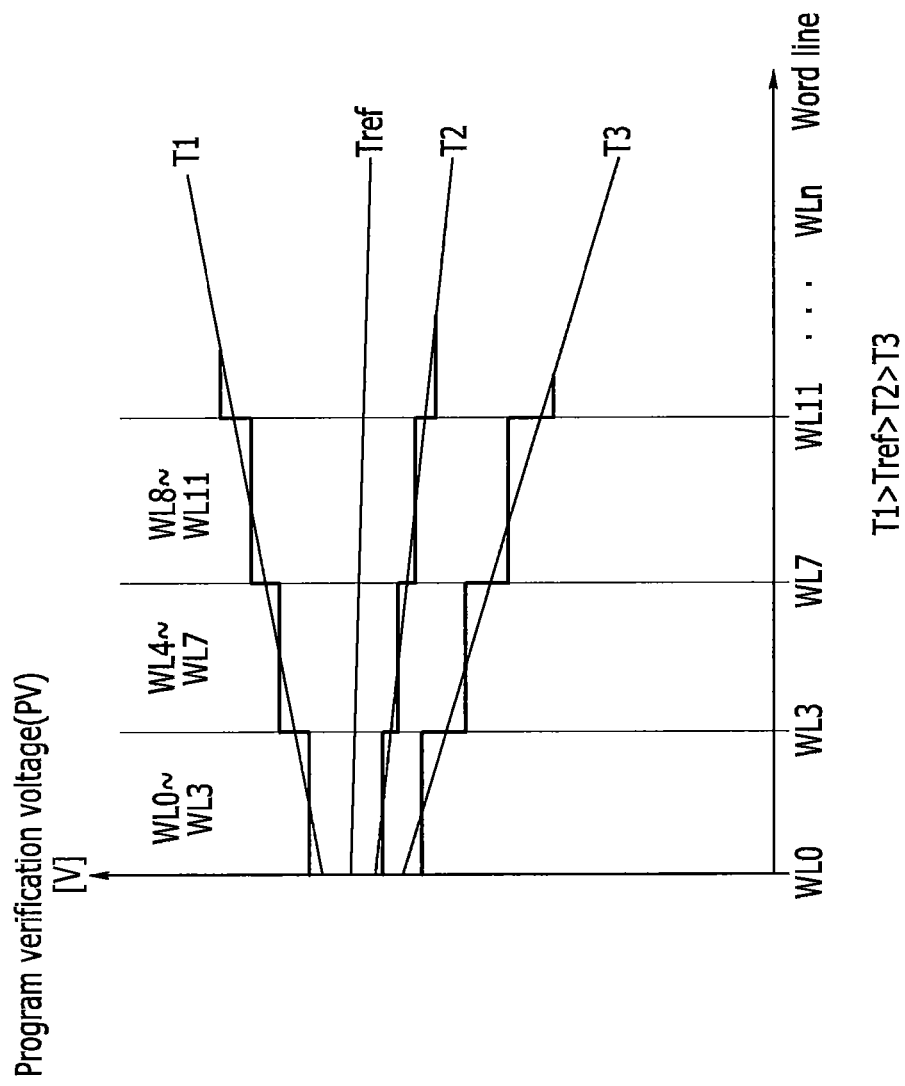
FIG. 16A is a diagram describing a compensation for a program verification voltage for each word line group according to an exemplary embodiment.

FIG. 16A is a diagram describing a compensation for a program verification voltage for each word line group according to an exemplary embodiment.

FIG. 16A illustrates the setting of a program verification voltage when the program verification temperature compensation coefficient is applied in a unit of the word line group as illustrated in FIG. 15. This is similar to FIG. 9A, so that a detailed description will be omitted.

Further, FIG. 16A illustrates that the number of word lines for each word line group for each of the temperatures T1, T2, and T3 is the same, but the present invention is not limited thereto. The number of word lines for each word line group may be different according to the temperatures T1 to T3.

FIG. 16B is a diagram describing a compensation for a program verification voltage for each word line group according to an exemplary embodiment.

As illustrated in FIG. 16B, the number of word lines for each word line group at the temperature T1 may be set to four, the number of word lines for each word line group at the temperature T2 may be set to five, and the number of word lines for each word line group at the temperature T3 may be set to three. The number of word lines for each word line group may be changed in consideration of a degree of change in the program verification voltage PV according to the positions of the word lines WL0 to WLn according to a program verification temperature.

Figure 12B:
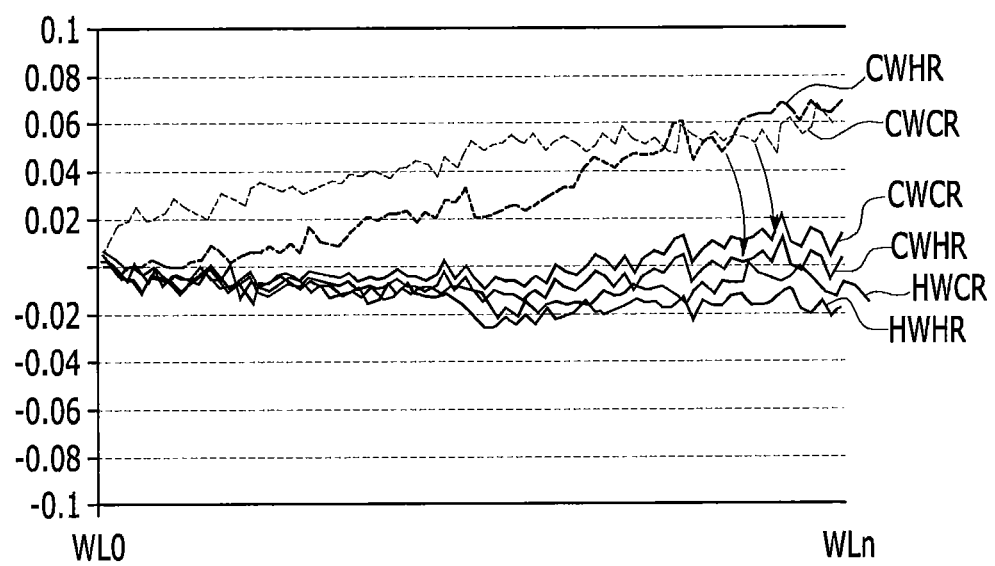

FIG. 12B is a diagram conceptually describing a change in a threshold voltage according to a temperature during a program and a temperature during a read after a program verification voltage is compensated according to an exemplary embodiment.

In a case where a change in a threshold voltage according to a temperature change based on a position of a selected word line is compensated during the program verification operation through the compensation for the program verification voltage, the program verification voltage is decreased when a temperature during the program operation is low. Then, as illustrated in FIG. 12B, a threshold voltage distribution deviation when the program verification operation is performed at a low temperature and the read operation is performed at a high temperature (CWHR), and a threshold voltage distribution deviation when the program verification operation is performed at a low temperature and the read operation is performed at a low temperature (CWCR) may be removed.

Figure 17:
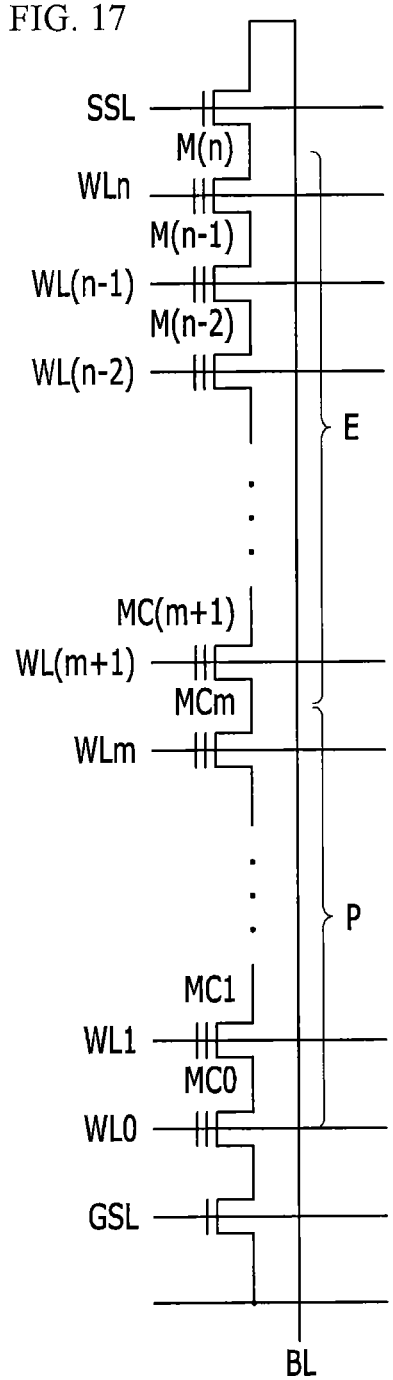
FIG. 17 is a diagram describing back pattern dependency (BPD) in a memory cell string.
Figure 17:
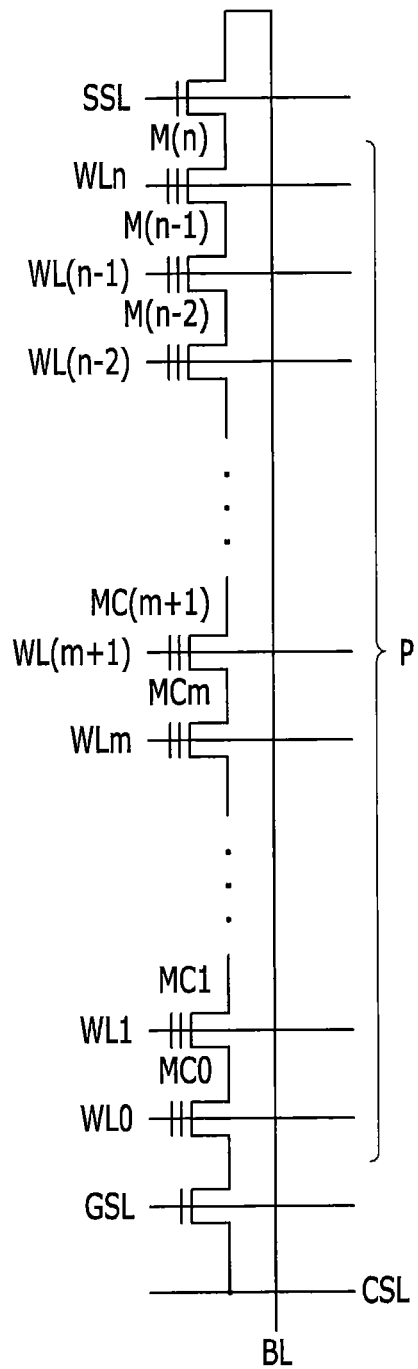

FIG. 17 is a diagram describing back pattern dependency (BPD) in a memory cell string.

The program operation may be performed on the plurality of memory cells included in the memory cell string in an order from a memory cell, that is, the memory cell 0 MC0, close to the ground selection transistor, to the memory cell far from the ground selection transistor. That is, the memory cell MC0 connected to the word line 0 WL0 is first programmed and the memory cell MCn connected to the word line n WLn is last programmed. This is related to the order of the performance of the program operation of the memory cells included in the memory cell string, and when a data value is a value corresponding to an erase distribution, a threshold voltage may be left in the erase distribution after the program operation.

FIG. 17(a) is a case where in the memory cell string, up to the memory cell MCm is programmed, and from the memory cell MC(m+1) is not programmed, and is a back pattern case when the program verification operation is performed on the memory cell MCm. FIG. 17(b) is a case where all of the memory cells within the memory cell string are programmed. This may be a back pattern situation when the read operation is performed on the memory cell MCm. In the two cases, the threshold voltage of the memory cell MCm may be higher in the case of FIG. 17(b). The reason is that the program operation is performed on the memory cells MC(m+1) to MCn in FIG. 17(b), so that an increase in channel resistance by a unselected memory cell may be larger than FIG. 17(a). That is, the threshold voltage during the read operation may be present to be higher than the threshold voltage during the program verification operation. A size of the change in the threshold voltage resulting from the back pattern dependency may be varied according to a size of a read pass voltage applied to the unselected word line during the read operation. Further, the size of the change in the threshold voltage resulting from the back pattern dependency may be different between the single level cell and the multi-level cell. The reason is that a position of the program threshold voltage distribution in the single level cell may be different from a position of the program threshold voltage distribution in the multi-level cell.

Figure 18:
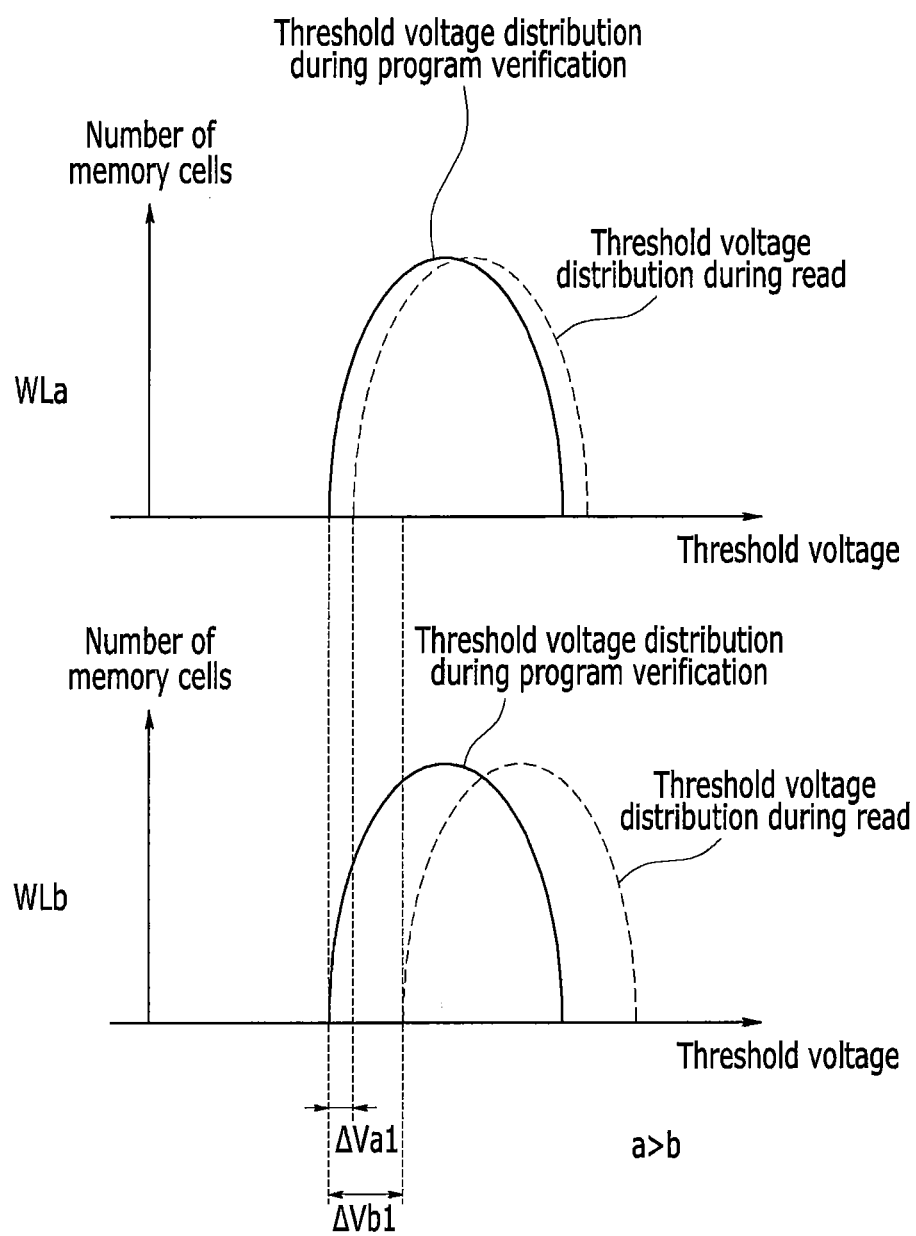
FIG. 18 is a diagram describing a change in a threshold voltage distribution by BPD according to an exemplary embodiment.

FIG. 18 is a diagram describing a change in a threshold voltage distribution by back pattern dependency (BPD) according to an exemplary embodiment.

The program operation may be performed on the memory cells included in the memory cell string in an order from the memory cell close to the ground selection transistor to the memory cell far from the ground selection transistor. In this case, a threshold voltage movement by the BPD may be larger in the memory cell close to the ground selection transistor than the memory cell far from the ground selection transistor. A movement size ΔVb1 of the threshold voltage distribution during the read compared to the threshold voltage distribution during the program verification in the word line b WLb relatively close to the ground selection line may be larger than a movement size ΔVa1 of the threshold voltage distribution during the read compared to the threshold voltage distribution during the program verification in the word line a WLa relatively far from the ground selection line.

Figure 19:
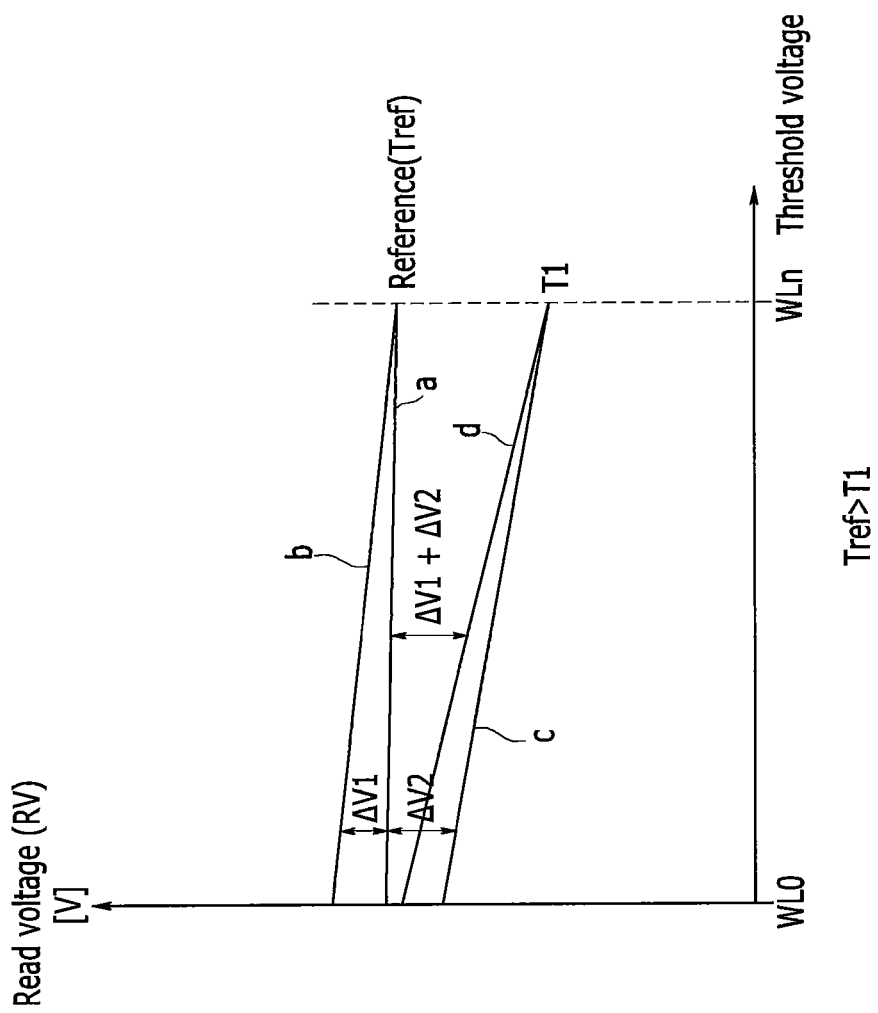
FIG. 19 is a diagram describing a compensation for a read voltage according to an exemplary embodiment.

FIG. 19 is a diagram describing a compensation for a read voltage according to an exemplary embodiment.

A movement of the threshold voltage by the BPD may be offset with the compensation for the read voltage in the read operation or the compensation for the program verification voltage in the program verification operation. For example, when the compensation for the BPD is performed in the read operation, a separate compensation operation is not required in the program verification operation. Contrary to this, when the compensation for the BPD is performed in the program verification operation, a separate compensation operation is not required in the read operation.

FIG. 19 describes a case where a threshold voltage movement by the BPD is compensated in the read operation. For example, when a read voltage for the memory cell close to the ground selection transistor is set to be higher than that of the memory cell far from the ground selection transistor, the threshold voltage movement by the BPD may be offset as illustrated in reference numeral b of FIG. 19. Further, when a read voltage compensation c based on the position of the selected word line and the temperature change is additionally performed, the read voltage may be finally set as denoted with reference numeral d.

Figure 20:
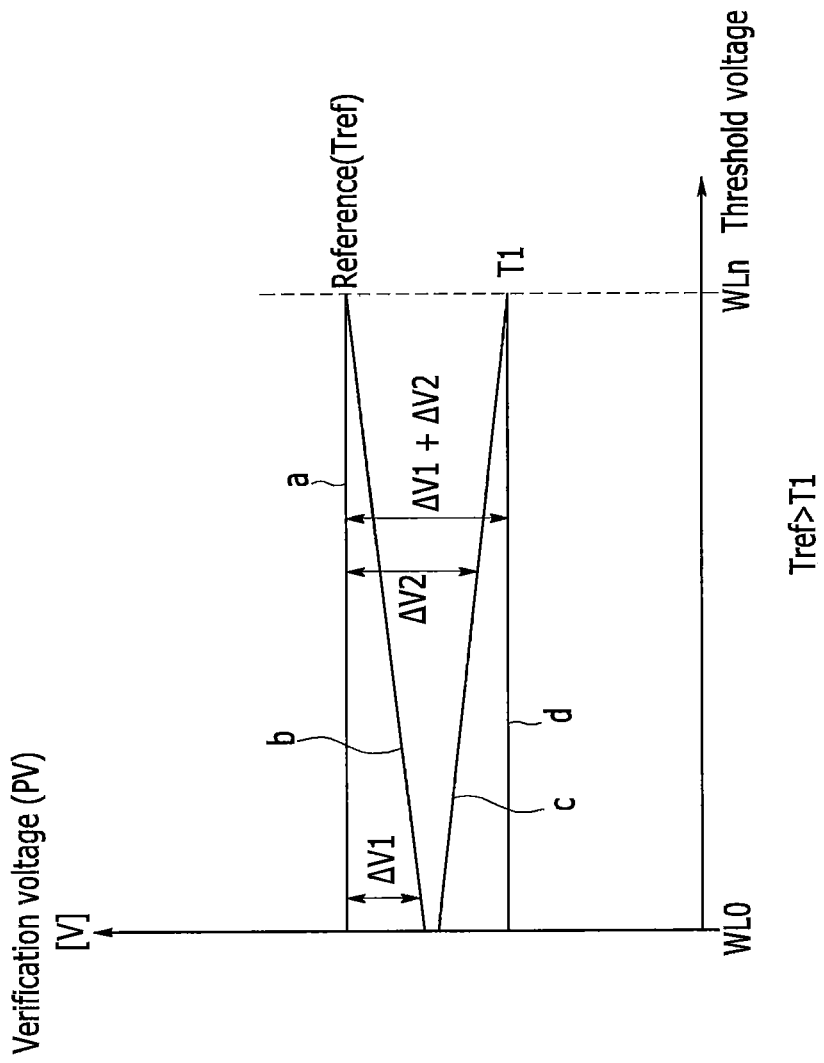
FIG. 20 is a diagram describing a compensation for a program verification voltage according to an exemplary embodiment.

FIG. 20 is a diagram describing a compensation for a program verification voltage according to an exemplary embodiment.

FIG. 20 describes a case where a threshold voltage movement by the BPD is compensated in the program verification operation. For example, when a program verification voltage for the memory cell close to the ground selection transistor is set to be lower than that of the memory cell far from the ground selection transistor as denoted with reference numeral b in FIG. 20, the threshold voltage movement by the BPD may be offset. Further, when a program verification voltage compensation c based on the position of the selected word line and the temperature change is additionally performed, the program verification voltage may be finally set as denoted with reference numeral d.

Figure 21:
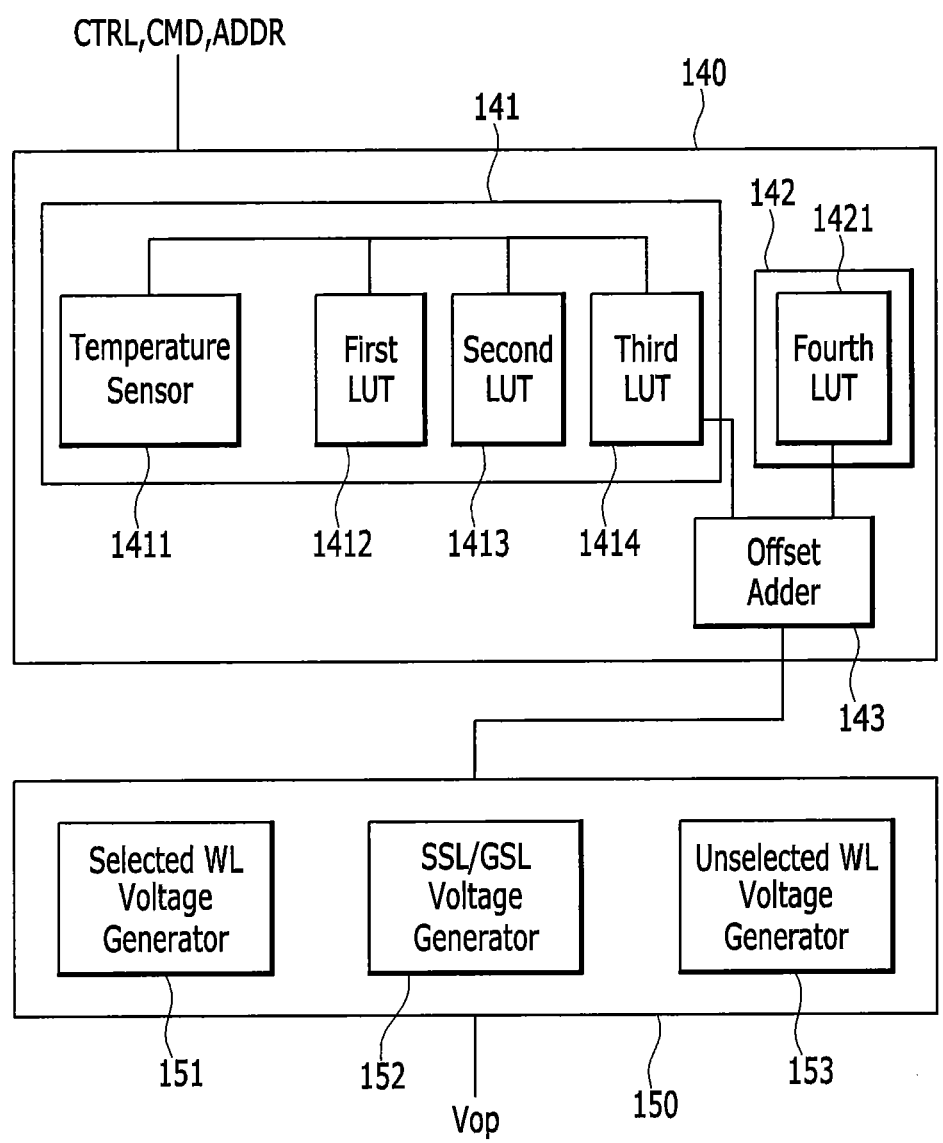
FIG. 21 is a diagram describing a voltage generator and a control logic of FIG. 1 according to an exemplary embodiment in detail.

FIG. 21 is a diagram describing the voltage generator and the control logic of FIG. 1 according to an exemplary embodiment in detail.

Referring to FIG. 21, the control logic 140 may include a first compensator 141, a second compensator 142, and an offset adder 143. The first compensator 141 may store information related to a temperature compensation and perform a control. The first compensator 141 may be operated in response to an address ADDR and a command CMD. The first compensator 141 may include a temperature sensor 1411, a first lookup table (First LUT) 1412, a second lookup table (Second LUT) 1413, and a third lookup table (Third LUT) 1414. Each of the first to third lookup tables may include a plurality of registers. The temperature sensor 1411 may detect an operation temperature of the non-volatile memory device. When power is applied to the non-volatile memory device, the temperature sensor 1411 may always be activated, and may be changed from an inactive state to an active state in response to the command CMD applied from the outside. The temperature sensor 1411 may transmit information on a detected temperature level to the first to third lookup tables. The information on the detected temperature level may have a form of a binary code.

The first LUT 1412 may store information for compensating for a read voltage temperature during the read operation. For example, the first LUT 1412 may store information about the degree of compensating for a temperature of a read voltage according to a distance between the ground selection line and the selected word line. The distance between the ground selection line and the selected word line may be derived from the address ADDR, particularly, a page address. Further, the first LUT 1412 may also separately store information on the first read temperature compensation coefficient and information on the second read temperature compensation coefficient of FIG. 6. For example, the first LUT 1412 may also store a size of a read voltage which needs to be compensated in a unit of a temperature change of 1° C., and may also store a size of a read voltage which needs to be compensated in a unit of a temperature change of 10° C. in order to decrease complexity in implementing a circuit. When the first LUT 1412 stores the size of the read voltage which needs to be compensated in the unit of a temperature change of 10° C., for example, an operation temperature is 25° C. to 34° C., the first LUT 1412 may have the same read compensation voltage The first LUT 1412 may also store the degree of temperature compensation for a read voltage in a unit of the word line group as described with reference to FIGS. 8 and 9. The first LUT 1412 may output the offset of the read voltage drawn by the aforementioned method in response to the temperature level detected by the temperature sensor 1411, and the address ADDR and the command CMD. The first LUT may also store whether the memory cell, on which the read or program verification is performed, is a single level cell or a multi-level cell, and store a different offset value according to a level of the read voltage or the verification voltage when the memory cell is the multi-level cell.

The second LUT 1413 may store and output information for compensation for a temperature of a program verification voltage in response to the information on the temperature level detected by the temperature sensor 1411. The method of storing and outputting the information is similar to that of the first LUT 1412, so that a detailed description thereof will be omitted.

The third LUT 1414 may store and output information about the compensation for a program verification pass voltage, a read pass voltage, or a program voltage according to a temperature change in response to the information on the temperature level detected by the temperature sensor 1411.

The second compensator 142 may be operated in response to an address ADDR and a command CMD, and may include a fourth lookup table (fourth LUT) 1421. The fourth LUT 1421 may store information for compensating for a movement of a threshold voltage by the BPD. The fourth LUT may output an offset of a read voltage or a program verification voltage for offsetting the movement of the threshold voltage by the BPD for a selected page in response to the address ADDR.

Each of the first to fourth lookup tables may include a plurality of registers. When a power supply is turned off, data in the register may be lost, so that the information stored in the first to fourth lookup tables may be stored in the memory block 111 of the memory cell array 110. The information stored in the memory block may be output from the memory block and transmitted to the first to fourth lookup tables in response to power-up or a command applied from the outside. Further, the information stored in the first to fourth lookup tables may be changed by an external control.

The voltage generator 150 may include a selected word line (WL) voltage generator 151 generating a read voltage and a program verification voltage, a string selection line/ground selection line voltage generator (SSL/GSL voltage generator 152 generating a voltage applied to the string selection line and a voltage applied to the ground selection line during a program and a read operation, and an unselected word line (WL) voltage generator 153 generating a read pass voltage and a program verification pass voltage.

The offset values output from the first compensator 141 and a second compensator 142 may be added through the offset adder 143 and transmitted to the voltage generator 150. For example, the offset output from the first LUT during the read operation and/or the offset output from the fourth LUT is added through the offset adder 143 and is transmitted to the selected WL voltage generator 151 during the read operation, and the selected WL voltage generator 151 may generate a read voltage in response to the added offset value. In the program verification operation, the offset output from the second LUT and/or the offset output from the fourth LUT are added through the offset adder 143 and are transmitted to the selected WL voltage generator 151, and the selected WL voltage generator 151 may generate a program verification voltage in response to the added offset value added through the offset adder 143.

The SSL/GSL voltage generator 152 may generate a voltage applied to the string selection line and a voltage applied to the ground selection line during the program and read operations in response to the voltage offset information according to a temperature output from the control logic 140. The unselected WL voltage generator 153 may generate a read pass voltage and a program verification pass voltage in response to the voltage offset information according to a temperature output from the control logic 140.

Figure 22:
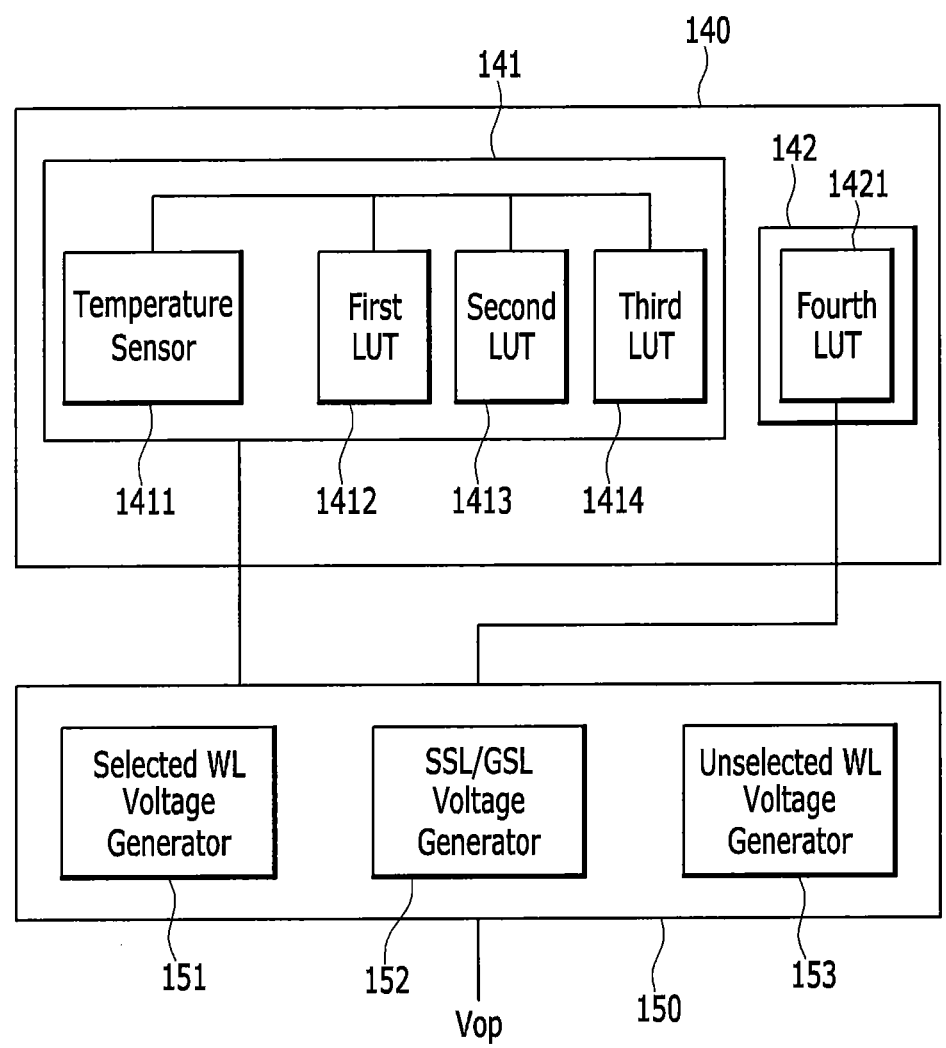
FIG. 22 is a diagram describing a voltage generator and a control logic of FIG. 1 according to an exemplary embodiment in detail.

FIG. 22 is a diagram describing the voltage generator and the control logic of FIG. 1 according to an exemplary embodiment in detail.

Referring to FIG. 22, the offset information output from the first compensator 141 may be directly input to the voltage generator 150 without passing through the offset adder 143 of FIG. 21. Further, the offset information output from the first compensator 141 may be a plurality of signals in a form of an analog voltage having continuous values. A first analog voltage signal output from the first compensator 141 may be input into the selected WL voltage generator 151 and control the generation of a read voltage and a program verification voltage. As one exemplary embodiment, the selected WL voltage generator 151 may include an amplification circuit, and the first analog voltage signal may be input into the amplification circuit to control offsets of a read voltage and a program verification voltage. In this case, the offset value output from the second compensator 142 may be in a form of a binary code, and the selected WL voltage generator 151 may vary the read voltage or the program verification voltage in response to a back pattern compensation offset signal in a form of a binary code.

Figure 23:
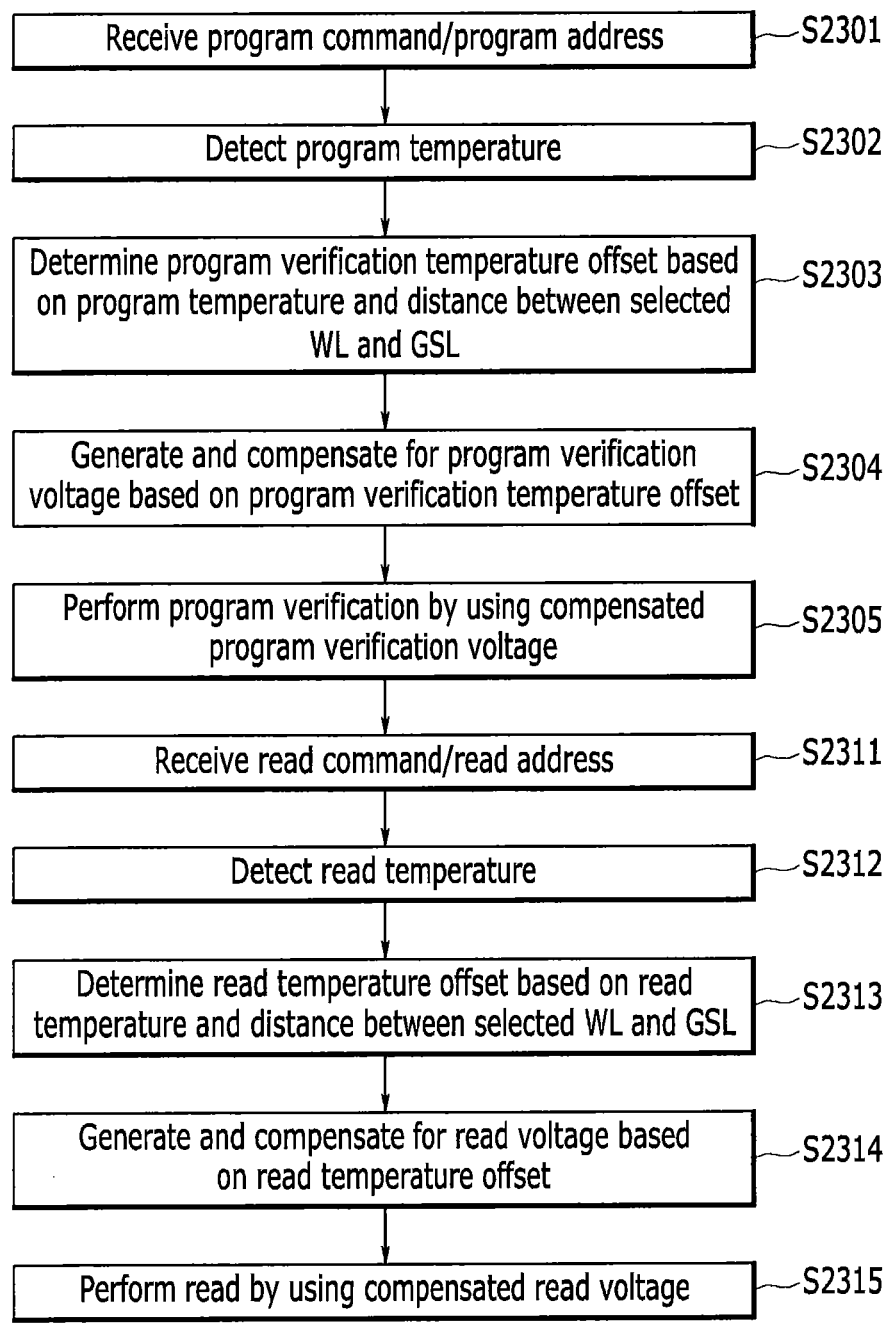
FIG. 23 is a schematic flowchart of a method of compensating for a read voltage and a program verification voltage according to an exemplary embodiment.

FIG. 23 is a schematic flowchart of a method of compensating for a read voltage and a program verification voltage according to an exemplary embodiment.

Referring to FIG. 23, when the non-volatile memory device receives a program command and a program address (S2301), the control logic 140 detects a program temperature of the non-volatile memory device (S2302). The detection of the program temperature of the non-volatile memory device by the control logic 140 may be performed in response to the program command or may also be performed regardless of the program command. For example, operation S2302 may be continuously performed in the entire program operation. In this case, the detection of the program temperature of the non-volatile memory device by the control logic 140 may be performed in response to a changed temperature during the program operation. This may be equally applied to operation S2312. A program verification temperature offset is determined based on the detected program temperature and a distance between a selected word line and a ground selection line GSL of a selected block (S2303). Then, a program verification voltage is generated and compensated based on the determined program verification temperature offset (S2304), and a program verification operation is performed by using the compensated program verification voltage (S2305). Information on the distance between the selected word line and a ground selection line GSL of the selected block may be generated in response to the received program address. A particular method of determining the program verification temperature offset based on the detected program temperature and the distance between the selected word line and the ground selection line GSL of the selected block is the same as the previously described method, so that a detailed description thereof will be omitted.

After the program operation on the memory cells connected to the selected word line is completed, the non-volatile memory device may receive a read command and an address (S2311). The control logic 140 detects a read temperature of the non-volatile memory device (S2302), and determines a read temperature offset based on the detected read temperature and the distance between the selected word line and the ground selection line GSL of the selected block (S2313). Then, a read voltage is generated and compensated based on the determined read temperature offset (S2314), and a read operation is performed by using the compensated read voltage (S2315).

Figure 24:
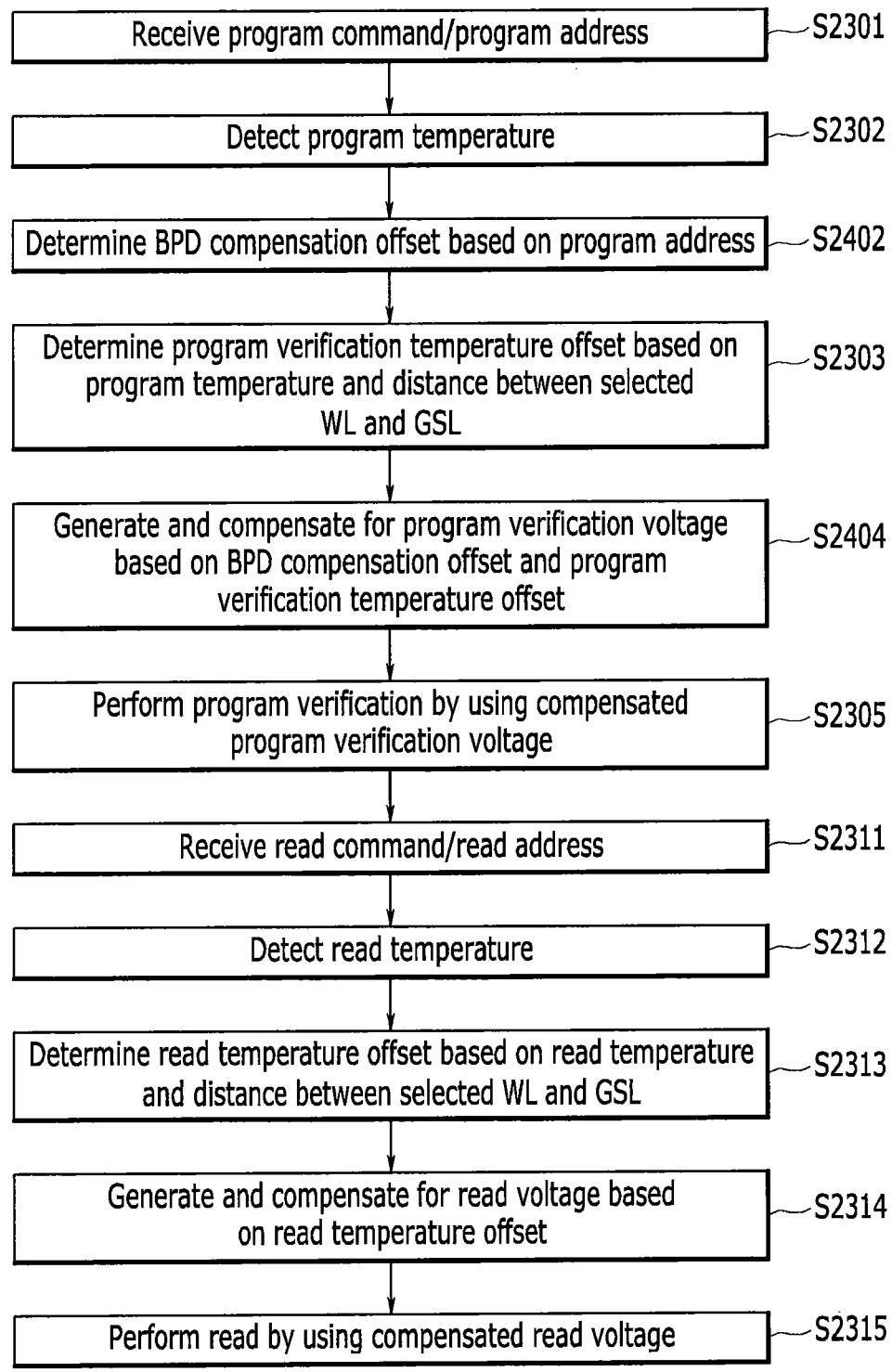
FIG. 24 is a schematic flowchart of a method of compensating for a read voltage and a program verification voltage according to an exemplary embodiment.

FIG. 24 is a schematic flowchart of a method of compensating for a read voltage and a program verification voltage according to an exemplary embodiment.

Referring to FIG. 24, differently from FIG. 23, operation S2402 of determining a BPD compensation offset based on a received program address is added. A method of determining the BPD compensation offset is the same as the previously described method, so that a detailed description thereof will be omitted. Further, differently from operation S2304 of FIG. 23, a program verification voltage is generated and compensated based on the BPD compensation offset and the determined program verification temperature offset (S2404).

Figure 25:
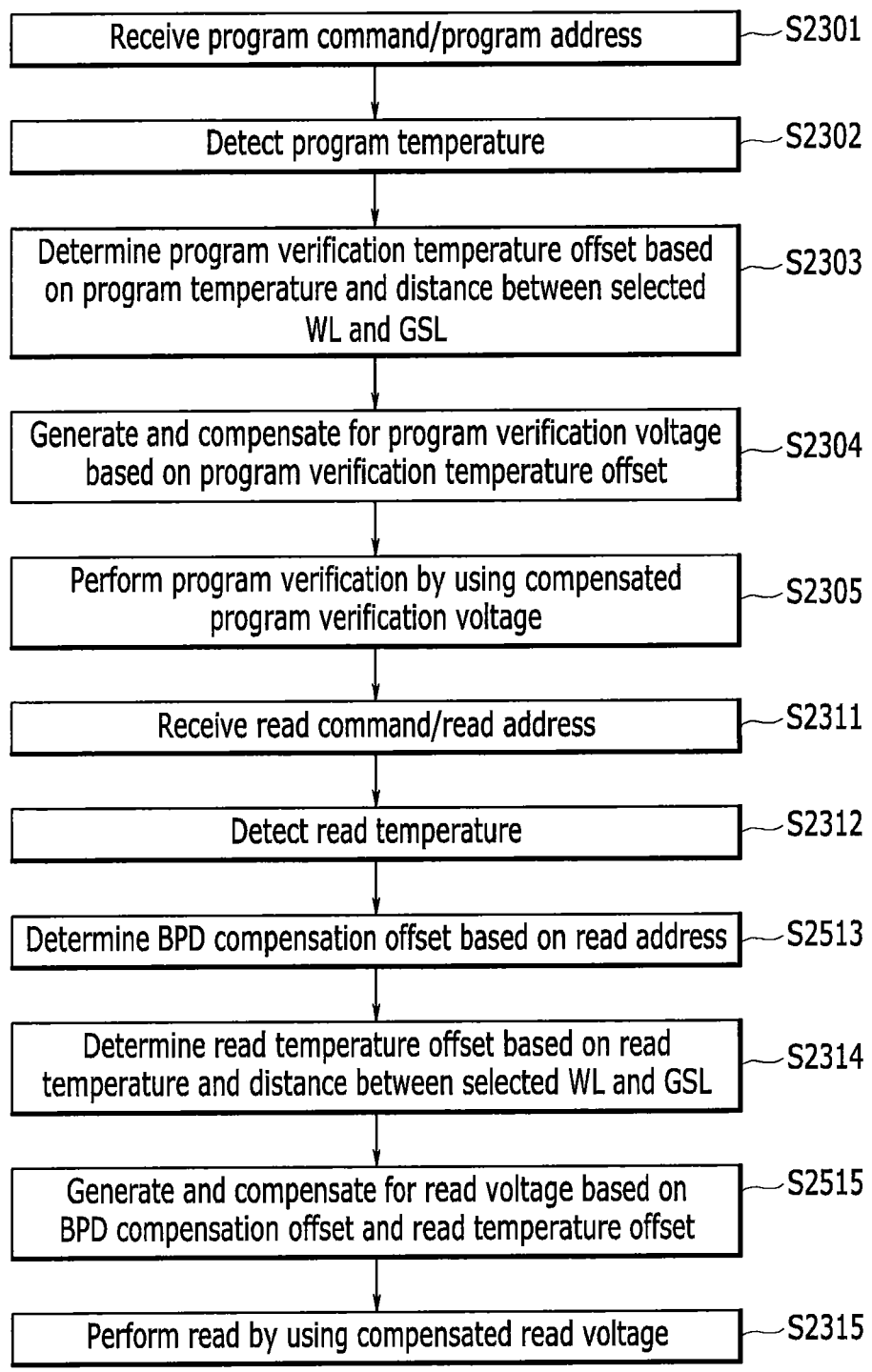
FIG. 25 is a schematic flowchart of a method of compensating for a read voltage and a program verification voltage according to an exemplary embodiment.

FIG. 25 is a schematic flowchart of a method of compensating for a read voltage and a program verification voltage according to an exemplary embodiment.

Referring to FIG. 25, differently from FIG. 23, operation S2513 of determining a BPD compensation offset based on a received read address is added. Further, differently from operation S2313 of FIG. 23, a read voltage is generated and compensated based on the BPD compensation offset and the determined read temperature offset (S2515).

Figure 26:
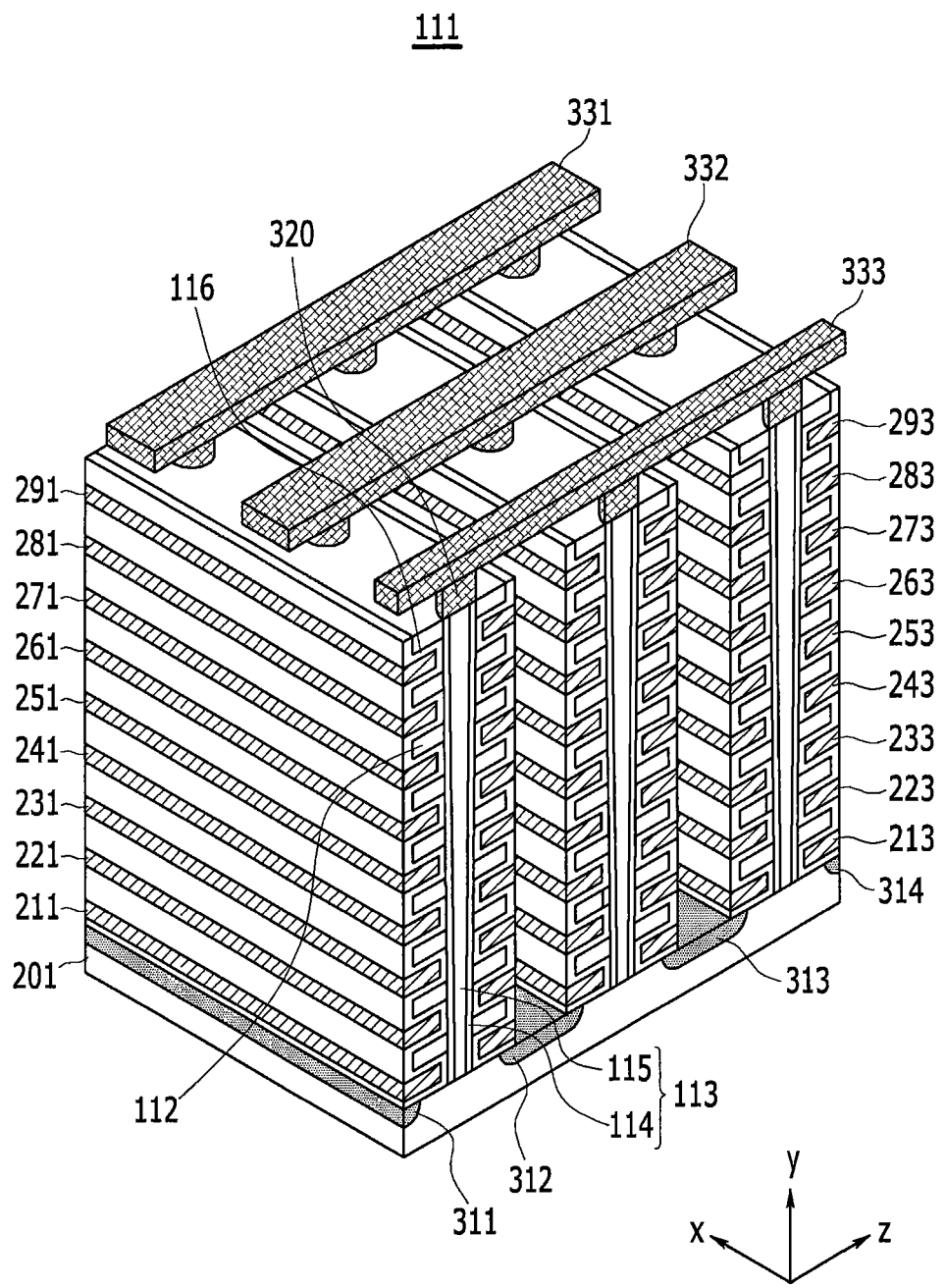
FIG. 26 is a diagram describing a memory block of FIG. 1 according to an exemplary embodiment in detail.

FIG. 26 is a diagram describing the memory block of FIG. 1 according to an exemplary embodiment in detail.

Referring to FIG. 26, the memory block 111 includes memory cell strings which are formed by vertically laminating memory cells on a substrate in a 3D structure. The memory blocks 111 includes structures elongated in a plurality of directions x, y, and z which are vertical to one another. In order to form the memory block 111, first, a substrate 201 is provided. For example, the substrate 201 may be formed of a P-well, which is formed by injecting a group 5 element, such as boron (B). Otherwise, the substrate 201 may be formed in a pocket P-well provided within an N-well. Hereinafter, it is assumed that the substrate 201 is a P-well. However, the substrate 201 is not limited to the P-well. The substrate 201 is formed to be parallel to an xz plate (plane), and is vertical in a y-axis direction.

A plurality of doping regions 311 to 314 is formed on the substrate 201. For example, the plurality of doping regions 311 to 314 may be formed of an n-type conductor different from the substrate 201. Hereinafter, it is assumed that first to fourth doping regions 311 to 314 have an n-type. However, the present invention is not limited to the feature that the first to fourth doping regions 311 to 314 have an n-type.

A plurality of insulating materials 112 elongated in an x-axis direction is sequentially provided in a z-axis direction on a region of the substrate 201 between the first and second doping regions 311 and 312. For example, the plurality of insulating materials 112 may be formed in the z-axis direction while being spaced apart from each other by a specific distance. For example, the insulating materials 112 may include an insulating material, such as a silicon oxide.

A pillar 113 passing through the insulating materials 112 is formed on the substrate 201 between the first and second doping regions 311 and 312. For example, the pillar 113 may pass through the insulating material 112 and be connected with the substrate 201. Here, the pillar 113 is also formed on the substrate between the second and third doping regions 312 and 313, and on the substrate between the third and fourth doping regions 313 and 314. The pillar 113 may form a channel during a read or program verification operation of the memory cell string. A diameter of a channel hole may be decreased as being close to the substrate 201 as illustrated in FIG. 26. Further, a diameter of the channel hole may be increased as being far from the substrate and then decreased again from a specific moment like a pot shape. That is, the channel hole may also be formed so that a center portion of the channel hole is convex. For example, each pillar 113 may be formed of a plurality of materials. For example, a surface layer 114 of each pillar 113 may include a silicon material having a first type. For example, the surface layer 114 of each pillar 113 may include a silicon material having the same type as that of the substrate 201. Hereinafter, it is assumed that the surface layer 114 of each pillar 113 includes p-type silicon. However, the present invention is not limited to the feature that the surface layer 114 of each pillar 113 includes p-type silicon. An internal layer 115 of each pillar 113 may be formed of an insulating material. For example, the internal layer 115 of each pillar 113 may include an insulating material, such as a silicon oxide. For example, the internal layer 115 of each pillar 113 may include an air gap.

An insulating layer 116 is provided along the insulating materials 112, the pillars 113, and the exposed surface of the substrate 201 between the first and second doping regions 311 and 312. For example, the insulating layer 116 provided on an exposed surface in the y-axis direction of the last insulating material 112, which is provided in the z-axis direction, may be removed. First conductive materials 211 to 291 are provided on an exposed surface of the insulating layer 116 in the region between the first and second doping regions 311 and 312. For example, the first conductive material 211 elongated in the x-axis direction is provided between the insulating material 112 adjacent to the substrate 201 and the substrate 201. More particularly, the first conductive material 211 elongated in the x-axis direction is provided between the insulating layer 116 on a lower surface of the insulating material 112 adjacent to the substrate 201 and the substrate 201.

The first conductive material elongated in the x-axis direction is provided between the insulating layer 116 on an upper surface of a specific insulating material among the insulating materials 112 and the insulating layer 116 on a lower surface of the insulating material disposed on the specific insulating material. For example, the first conductive materials 221 to 281 elongated in the x-axis direction are provided between the insulating materials 112. For example, the first conductive materials 211 to 291 may be metal materials. For example, the first conductive materials 211 to 291 may be conductive materials, such as poly silicon.

The same structure as the structure on the first and second doping regions 311 and 312 may be provided in the regions between the second and third doping regions 312 and 313 and the third and fourth regions 313 and 314.

Drains 320 are provided on the plurality of pillars 113, respectively. Second conductive materials 331 to 333 elongated in the z-axis direction are provided on the drains 320. The second conductive materials 331 to 333 are sequentially disposed in the x-axis direction. The second conductive materials 331 to 333 are connected to the drains 320 in corresponding regions, respectively. For example, the drains 320 and the second conductive material 333 elongated in the x-axis direction may be connected through contact plugs, respectively. For example, the second conductive materials 331 to 333 may be metal materials. For example, the second conductive materials 331 to 333 may be conductive materials, such as poly silicon.

Figure 27:
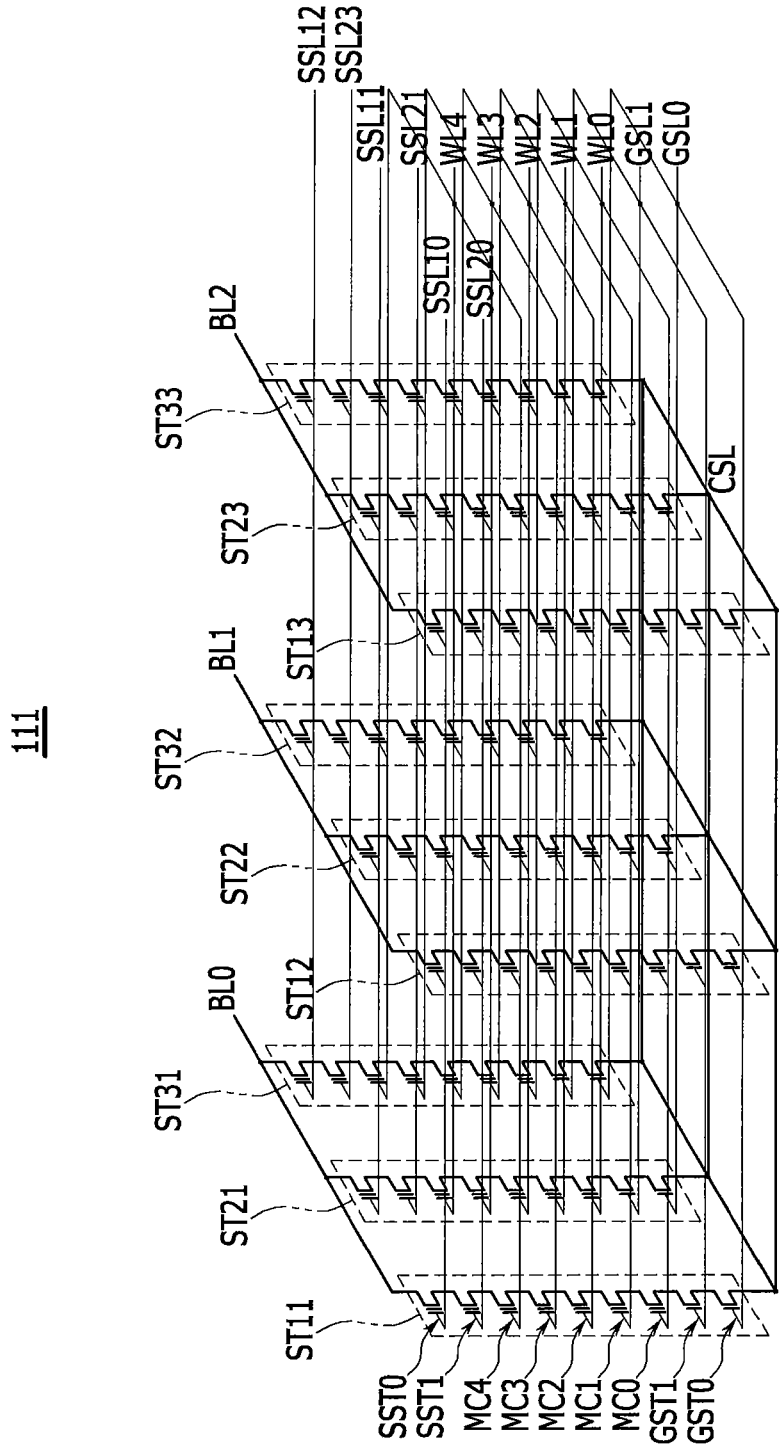
FIG. 27 is a diagram describing a circuit diagram of a memory block of FIG. 1 according to an exemplary embodiment in detail.

FIG. 27 is a diagram describing a circuit diagram of the memory block of FIG. 1 according to an exemplary embodiment in detail.

FIG. 27 is a circuit diagram illustrating an equivalent circuit of the memory block having the 3D structure described with reference to FIG. 26. Memory cell strings ST11, ST21, and ST31 are connected between a bit line 0 BL0 and a common source line CSL. The bit line 0 BL0 corresponds to the conductive material 331 elongated in the z-axis direction. Memory cell strings ST12, ST22, and ST32 are connected between a bit line 1 BL1 and the common source line CSL. The bit line 1 BL1 corresponds to the conductive material 332 elongated in the z-axis direction. Memory cell strings ST13, ST23, and ST33 are connected between a bit line 2 BL2 and the common source line CSL. The bit line 2 BL2 corresponds to the conductive material 333 elongated in the z-axis direction.

Each memory cell string ST includes a plurality of serially connected memory cells MC0 to MC4. The plurality of memory cells MC0 to MC4 may be laminated on the substrate 201 in a vertical direction. Each memory cell MC may be implemented with a charge trap flash memory cell (CTF) having a charge trap layer. Further, each memory cell MC may also be implemented with a floating gate memory cell having a floating gate. Each memory cell string ST may include one or more string selection transistors SSTs connected between the plurality of serially connected memory cells MC0 to MC4 and the corresponding bit line BL. Each memory cell string ST may include two serially connected string selection transistors SST0 and SST1 as illustrated in FIG. 27. The string selection transistor SST may be implemented with a memory cell having the same form as that of the memory cell MC. Each memory cell string ST may include one or more ground selection transistors GSTs connected between the plurality of serially connected memory cells MC0 to MC4 and the common source line CSL. Each memory cell string ST may include two serially connected ground selection transistors GST0 and GST1 as illustrated in FIG. 27. The ground selection transistor GST may also be implemented with a memory cell having the same form as that of the memory cell MC, or may also be implemented in a form of a general MOS transistor having no charge trap layer or floating gate.

Hereinafter, the strings ST are defined in a unit of a row and a column. The memory cell strings STs commonly connected to one bit line form one column. For example, the memory cell strings ST11 to ST31 connected to the bit line 0 BL0 correspond to a first column. The memory cell strings ST12 to ST32 connected to the bit line 1 BL1 correspond to a second column. The memory cell strings ST13 to ST33 connected to the bit line 2 BL2 correspond to a third column.

The strings ST connected to one string selection line SSL form one row. For example, the strings ST11, ST12, and ST13 connected to a first string selection line SSL10 form a first row. The strings ST21, ST22, and ST23 connected to a second string selection line SSL11 form a second row. The strings ST31, ST32, and ST33 connected to a third string selection line SSL12 form a third row.

In each memory cell string ST, a height is defined. In the exemplary embodiment, in each memory cell string ST, a height of the memory cell MC0 adjacent to the second ground selection transistor GST1 compared to the substrate is 1. In each memory cell string ST, a height of the memory cell is increased when the memory cell is adjacent to the string selection transistor SST. In each memory cell string ST, a height of the memory cell MC4 adjacent to the second string selection transistor SST1 compared to the substrate is 5.

The memory cell strings STs in the same row share the string selection line SSL. The memory cell strings STs in the different rows are connected to the different string selection lines, respectively. The memory cells having the same height included in the memory cell strings STs in the same row share the word line WL. At the same height, the word lines WLs of the memory cell strings STs in the different rows are commonly connected. The word lines connected to the memory cell strings in the plurality of rows at the same height may be connected to one another at an end of one side of the memory block. Further, the word lines connected to the memory cell strings in the plurality of rows at the same height may be connected to one another at ends of both sides of the memory block.

The memory cell strings STs in the same row may share the ground selection line GSL. The memory cell strings STs in the different rows may share the ground selection line GSL. That is, the memory cell strings ST11 to ST13, ST21 to ST23, and ST31 to ST33 may be commonly connected to the ground selection line GSL. Further, the memory cell strings may be connected to a separate ground selection line GSL in the unit of the row, like the string selection line. The common source line CSL is commonly connected to the memory cell strings STs.

The word lines WLs at the same height may be commonly connected. Accordingly, when a specific word line WL is selected, all of the memory cell strings ST connected to the specific word line WL are selected. The memory cell strings ST in the different rows are connected to the different string selection lines SSL. Accordingly, the memory cell strings STs in an unselected row among the strings STs connected to the same word line WL may be separated from the corresponding bit line by selecting the first string selection lines SSL10 to SSL12 or the second selection lines SSL20 to SSL22. Further, the memory cell strings ST in a selected row may be selected in the unit of the column by selecting the bit lines BL0 to BL2.

In the exemplary embodiment, a program verification voltage or a read voltage is applied to a selected word line in a selected row, and a program verification pass voltage or a read pass voltage is applied to unselected word lines during the program verification or read operation.

Figure 28:
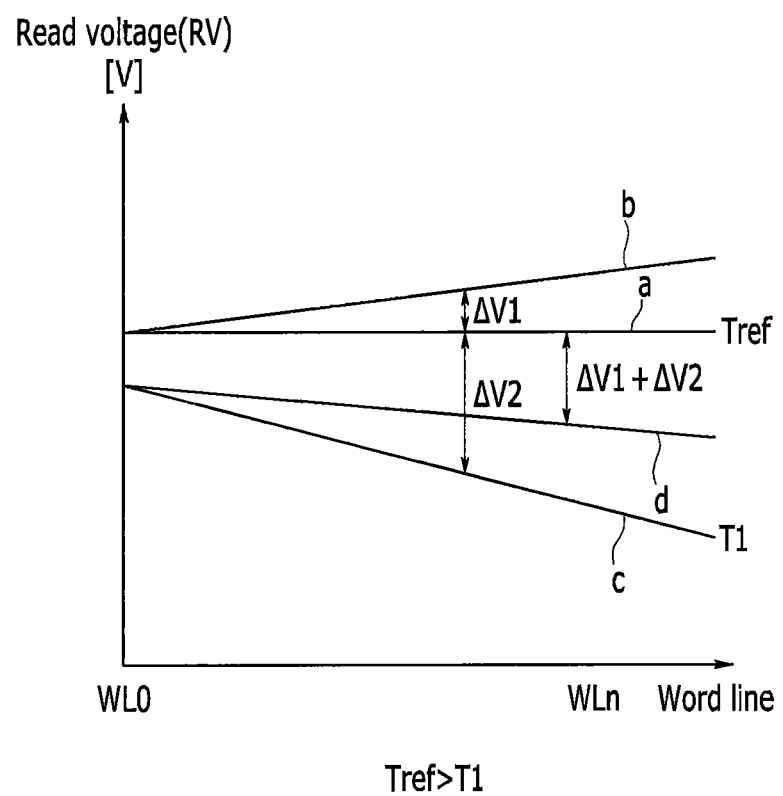
FIG. 28 is a diagram describing a compensation for a read voltage according to an exemplary embodiment.

FIG. 28 is a diagram describing a compensation for a read voltage according to an exemplary embodiment.

When the same voltage is applied to the word line in a case where the memory block has the 3D structure as illustrated in FIGS. 26 and 27, different electric fields may be generated according to a diameter of the channel hole. For example, when a diameter of the channel hole is small, the memory cell may be turned on with a lower voltage compared to a case where a diameter of the channel hole is large. Accordingly, in order to offset the difference, the voltage applied to the word line may be varied based on a distance between the selected word line and the substrate during the program verification and/or read operation.

FIG. 28 describes the method of compensating for a read voltage for a case where a diameter of the channel hole is decreased when the channel of the memory cell is close to the substrate as illustrated in FIG. 26. It is assumed that the word line 0 WL0 is closest to the substrate, and the word line n WLn is farthest from the substrate. A diameter of the channel hole is increased when the word line is far from the substrate, and only when the higher read voltage is applied, the same effect as that of the word line close to the substrate may be generated. Accordingly, the compensation for a read voltage denoted with reference numeral b may be required.

In order to offset the aforementioned movement effect of the threshold voltage according to a temperature, which is different according to a distance between the ground selection line and the word line, the read voltage compensation denoted with reference numeral c is required. As a result, in the 3D structure, in order to offset the movement effect of the threshold voltage according to a diameter of the channel hole and a temperature, which are different according to a distance between the ground selection line and the selected word line, the read voltage compensation denoted with reference numeral d may be required. Further, the aforementioned threshold voltage movement by the BPD may also be similarly generated even in the 3D structure, and the compensation may be needed.

Figure 29:
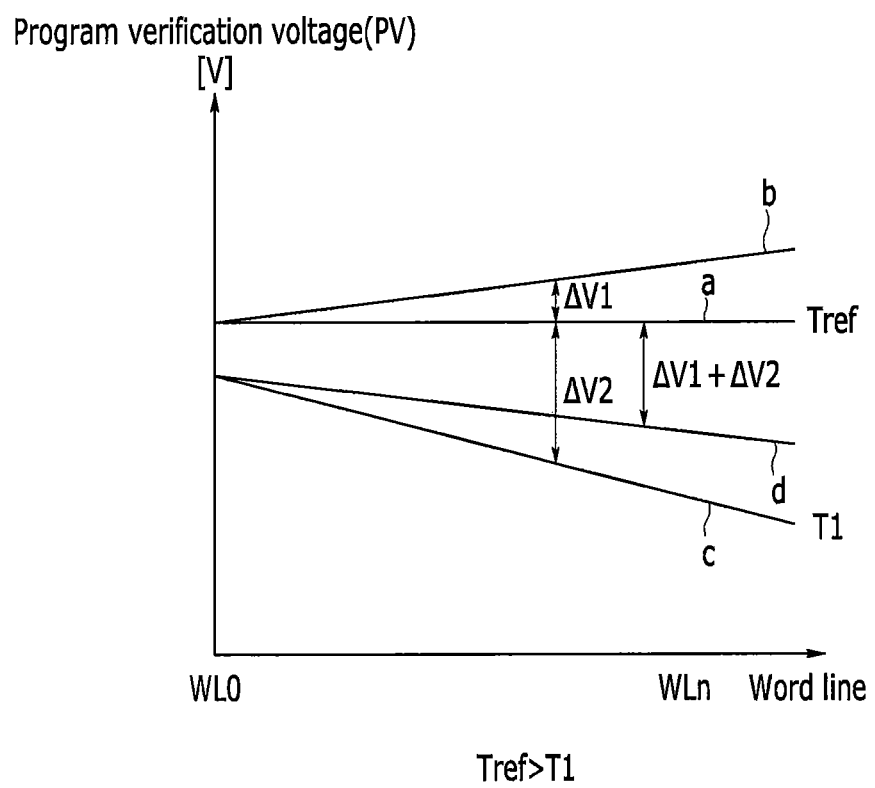
FIG. 29 is a diagram describing a compensation for a program verification voltage according to an exemplary embodiment.

FIG. 29 is a diagram describing a compensation for a program verification voltage according to an exemplary embodiment.

In order to offset a movement effect of a threshold voltage according to a diameter of the channel hole and a temperature, which are different according to a distance between the ground selection line or the substrate and the selected word line, in the 3D structure, a compensation for a program verification voltage, which is similar to the compensation for the read voltage, may also be required for a program verification voltage as illustrated in FIG. 29.

When the memory block has the 3D structure, the compensation method described with reference to FIGS. 6 to 16 may be applied as it is. Particularly, the method of determining a read temperature compensation coefficient and a program verification temperature compensation coefficient for each word line group, which is described with reference to FIGS. 8, 9A, 9B, 15, 16A, 16B, and the like, is applied.

FIG. 30 is a diagram describing a memory system according to an exemplary embodiment.

Referring to FIG. 30, a memory system 1000 may include a nonvolatile memory device 100 and a memory controller 200. The non-volatile memory 100 is the same as that described above, so that a detailed description will be omitted.

The memory controller 200 controls the non-volatile memory device 100 according to a request from the outside (for example, a host). In the exemplary embodiment, the memory controller 200 may apply a command and an address of the non-volatile memory device 100, and control read, program, and erase operations.

The memory controller 200 may be connected between the non-volatile memory device 100 and a host. The memory controller 200 may drive firmware for controlling the non-volatile memory device 100. The memory controller 200 may include an error correction circuit (ECC) 210, a buffer 220, a central processing unit (CPU) 230, a host interface 240, a ROM 250, and a memory interface 260. Further, the memory controller 200 may include a temperature compensator 270.

The central processing unit 230 controls a general operation of the memory controller 200. The buffer 220 is used as an operation memory of the central processing unit 230. When writing is requested from the host, data input from the host is temporarily stored in the buffer 220. Further, when the writing is requested from the host, data read from the non-volatile memory device 100 is temporarily stored in the buffer 220. The error correction circuit 210 encodes the data stored in the buffer 220 by using an error correction code when the writing is requested. In this case, the encoded data and parity data imposed on the encoded data is stored in a memory cell array included in the non-volatile memory device 100. In the meantime, the error correction circuit 210 decodes data read from the non-volatile memory device 100 by using an error correction code value when the writing is requested. The ROM stores data required for driving the memory controller 200.

The host interface 240 includes a protocol for performing data exchange between the host and the memory controller 200.

The memory interface 260 interfaces the non-volatile memory device 100 and the memory controller 200.

The temperature compensator 270 may detect an operation temperature of the memory system 1000, and control the memory controller 200 and the non-volatile memory device 100 based on the detected operation temperature. For example, when the non-volatile memory device 100 performs a read operation based on the detected operation temperature, the temperature compensator 270 may input read voltage compensation offset information into the non-volatile memory device 100 and compensate for a threshold voltage movement according to the operation temperature, and a position of a selected word line or a distance between the selected word line and a ground selection line connected to a selected block to enable the non-volatile memory device 100 to more precisely perform the read operation. The memory controller 200 may draw a position of a selected word line or a distance between the selected word line and a ground selection line connected to a selected block based on a read address input during the read request of the non-volatile memory device 100. Further, the memory controller 200 may draw a distance between a selected word line and a substrate based on a read address input during the read request of the non-volatile memory device 100, Similarly, the temperature compensator 270 may transmit information for compensating for a program verification voltage to the non-volatile memory device 100 in order to improve program reliability of the non-volatile memory device 100 even in a program verification operation like the read operation.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-volatile memory device, comprising:
   a memory cell array including a memory cell string including a ground selection transistor and a plurality of serially connected non-volatile memory cells;
   a ground selection line connected to the ground selection transistor and a plurality of word lines connected to the plurality of memory cells;
   a voltage generator configured to generate a program verification voltage and a read voltage applied to the plurality of word lines, wherein the program verification voltages applied to the plurality of word lines are equivalent at a reference temperature and the read voltages applied to the plurality of word lines are equivalent at the reference temperature; and
   a control circuit configured to control a compensation for the program verification voltage based on a program verification temperature offset, and then control a compensation for the read voltage based on a read temperature offset,
   wherein the program verification temperature offset is positive when the current temperature is greater than the reference temperature and the program verification temperature offset is negative when the current temperature is less than the reference temperature,
   wherein the read temperature offset is positive when the current temperature is greater than the reference temperature and the read temperature offset is negative when the current temperature is less than the reference temperature,
   wherein the compensation for the program verification voltage and the compensation for the read voltage are performed in correspondence with each other in order to eliminate a deviation due to a difference between the read temperature offset and the program verification temperature offset, wherein the plurality of word lines is divided into a plurality of word line groups including two or more word lines, and the control circuit sets a program verification temperature offset and a read temperature offset in a corresponding word line group among the plurality of word line groups according to a distance between one word line in each of the plurality of word line groups and the ground selection line and an operation temperature.

2. The non-volatile memory device of claim 1, wherein: an absolute value of the program verification temperature offset or the read temperature offset is sequentially increased when the distance between one word line in each of the plurality of word line groups and the ground selection line is increased.

3. The non-volatile memory device of claim 2, wherein: the program verification temperature offset corresponds to the read temperature offset.

4. The non-volatile memory device of claim 2, wherein: the program verification temperature offset or the read temperature offset is further increased in a negative direction when the operation temperature is decreased.

5. The non-volatile memory device of claim 1, wherein: the control circuit controls the compensation for the read voltage based on a back pattern compensation offset, and a size of the back pattern compensation offset is sequentially decreased when the distance between one word line in each of the plurality of word line groups and the ground selection line is increased.

6. The non-volatile memory device of claim 1, wherein: the control circuit controls the compensation for the program verification voltage based on a back pattern compensation offset, and a size of the back pattern compensation offset is sequentially decreased when the distance between one word line in each of the plurality of word line groups and the ground selection line is increased.

7. The non-volatile memory device of claim 1, wherein: the memory cell array includes single level cells and multi-level cells, and the program verification temperature offset or the read temperature offset corresponding to the single level cells is different from the program verification temperature offset or the read temperature offset corresponding to the multi-level cells.

8. A non-volatile memory device having a 3D structure, comprising:

a plurality of memory cell strings formed by laminating a plurality of memory cells in a vertical direction to a substrate;

a plurality of word lines connected to a ground selection transistor of each of the plurality of memory cell strings, and a plurality of serially connected non-volatile memory cells;

a voltage generator configured to generate a program verification voltage and a read voltage applied to the plurality of word lines, wherein the program verification voltages applied to the plurality of word lines are equivalent at a reference temperature and the read voltages applied to the plurality of word lines are equivalent at the reference temperature; and a control circuit configured to control a compensation for the program verification voltage based on a program verification temperature offset, and then control a compensation for the read voltage based on a read temperature offset, wherein the program verification temperature offset is positive when the current temperature is greater than the reference temperature and the program verification temperature offset is negative when the current temperature is less than the reference temperature, wherein the read temperature offset is positive when the current temperature is greater than the reference temperature and the read temperature offset is negative when the current temperature is less than the reference temperature, wherein the compensation for the program verification voltage and the compensation for the read voltage are performed in correspondence with each other in order to eliminate a deviation due to a difference between the read temperature offset and the program verification temperature offset, wherein the plurality of word lines is divided into a plurality of word line groups including two or more word lines, and the control circuit sets a program verification temperature offset and a read temperature offset in a corresponding word line group among the plurality of word line groups according to a distance between one word line in each of the plurality of word line groups and the substrate and an operation temperature.

9. The non-volatile memory device of claim 8, wherein: an absolute value of the program verification temperature offset or the read temperature offset is sequentially increased when the distance between one word line in each of the plurality of word line groups and the substrate is increased.

10. The non-volatile memory device of claim 9, wherein: the program verification temperature offset corresponds to the read temperature offset.

11. The non-volatile memory device of claim 9, wherein: the program verification temperature offset or the read temperature offset is further increased in a negative direction when the operation temperature is decreased.

12. The non-volatile memory device of claim 8, wherein: the control circuit compensates for and increases the read voltage when a distance between the plurality of word line and the substrate is increased.

13. The non-volatile memory device of claim 8, wherein: the control circuit compensates for and increases the program verification voltage when a distance between the plurality of word line and the substrate is increased.

14. A non-volatile memory device, comprising:

a memory cell array including a plurality of word lines including first and second word lines;

a voltage generator configured to generate a program verification voltage to be applied to the plurality of word lines during a program verification and a read voltage to be applied to the plurality of word lines during a data read, wherein the program verification voltages applied to the plurality of word lines are equivalent at a reference temperature and the read voltage applied to the plurality of word lines are equivalent at the reference temperature; and a control circuit configured to generate a verification offset for compensating for the verification voltage based on a temperature during the program verification and a position of a word line, to which the verification voltage is to applied, and then generate a read offset for compensating for the read voltage based on a temperature during the data read and the position of a word line, to which the read voltage is to be applied, and control a change direction between the verification offset and the read offset, wherein the verification offset is positive when the current temperature is greater than the reference temperature and the verification offset is negative when the current temperature is less than the reference temperature, wherein the read offset is positive when the current temperature is greater than the reference temperature and the read offset is negative when the current temperature is less than the reference temperature, wherein the compensation for the program verification voltage and the compensation for the read voltage are performed in correspondence with each other in order to eliminate a deviation due to a difference between the read temperature offset and the program verification temperature offset, wherein the plurality of word lines is divided into a plurality of word line groups including word lines having the number based on an operation temperature, the control circuit sets a verification offset and a read offset in a corresponding word line group among the plurality of word line groups according to a position of one word line in each of the plurality of word line groups and an operation temperature, and each of the first word line and the second word line belongs to a different word line group.

15. The non-volatile memory device of claim 14, wherein: the control circuit sets a first verification offset for compensating for a program verification voltage to be applied to the first word line to be higher than a second verification offset for compensating for a verification voltage to be applied to the second word line, and sets a first read offset for compensating for a read voltage to be applied to the first word line to be higher than a second read offset for compensating for a read voltage to be applied to the second word line.

16. The non-volatile memory device of claim 14, wherein: the first and second verification offsets and the first and second read offsets are changed according to a temperature.

17. The non-volatile memory device of claim 16, wherein: the control circuit sets the first verification offset when a temperature during the program verification is a first temperature to be lower than the first verification offset when a temperature during the program verification is a second temperature higher than the first temperature, and sets the first read offset when a temperature during the data read is the first temperature to be lower than the first read offset when a temperature during the data read is the second temperature.

18. The non-volatile memory device of claim 17, wherein: the memory cell array includes a plurality of memory cells connected to a bit line and the plurality of word line, and a memory cell connected to the second word line among the plurality of memory cells is more closely connected to the bit line than the memory cell connected to the first word line.

19. The non-volatile memory device of claim 17, wherein: the memory cell array includes a plurality of memory cells connected to a bit line and the plurality of word line, and a memory cell connected to the first word line among the plurality of memory cells is more closely connected to the bit line than the memory cell connected to the second word line.

20. The non-volatile memory device of claim 14, wherein: the control circuit changes the verification offset and the read offset in the same direction in proportion to a position of the plurality of word lines.

\* \* \* \* \*